United States Patent
Martineau et al.

(10) Patent No.: US 11,808,785 B2
(45) Date of Patent: Nov. 7, 2023

(54) RADIOFREQUENCY INTEGRATED CIRCUIT AND CORRESPONDING TEST METHOD

(71) Applicant: COMMISSARIAT A L'ENERGIE ATOMIQUE ET AUX ENERGIES ALTERNATIVES, Paris (FR)

(72) Inventors: Baudouin Martineau, Grenoble (FR); Cédric Dehos, Grenoble (FR)

(73) Assignee: Commissariat A L'energie Atomique Et Aux Energies Alternatives, Paris (FR)

( * ) Notice: Subject to any disclaimer, the term of this patent is extended or adjusted under 35 U.S.C. 154(b) by 333 days.

(21) Appl. No.: 17/077,809

(22) Filed: Oct. 22, 2020

(65) Prior Publication Data

US 2021/0116501 A1   Apr. 22, 2021

(30) Foreign Application Priority Data

Oct. 22, 2019   (FR) .................................... 1911797

(51) Int. Cl.
   *G01R 31/317*   (2006.01)
   *H03F 3/19*   (2006.01)
(52) U.S. Cl.
   CPC ......... *G01R 31/31724* (2013.01); *H03F 3/19* (2013.01); *H03F 2200/451* (2013.01)
(58) Field of Classification Search
   None
   See application file for complete search history.

(56) References Cited

U.S. PATENT DOCUMENTS

| 2009/0191838 | A1 | 7/2009 | Chang et al. |
| 2011/0234204 | A1* | 9/2011 | Tamura .............. G01R 31/2822 324/123 R |
| 2012/0257656 | A1 | 10/2012 | Kang et al. |
| 2012/0286836 | A1* | 11/2012 | Hsieh ................. G01R 31/2824 327/164 |
| 2016/0204881 | A1* | 7/2016 | Chung ............... G01R 31/2822 455/67.14 |

(Continued)

FOREIGN PATENT DOCUMENTS

| EP | 0 920 146 A2 | 6/1999 |
| EP | 1 201 051 A1 | 5/2002 |
| WO | 01/06685 A1 | 1/2001 |

OTHER PUBLICATIONS

Makhsuci, et al., "Oscillation-based Test for Measuring 1dB Gain Compression Point of Power Amplifiers", Electrical Engineering (ICEE), Iranian Conference on, pp. 190-195, May 8, 2018.

(Continued)

*Primary Examiner* — Patrick Assouad
*Assistant Examiner* — Haidong Zhang
(74) *Attorney, Agent, or Firm* — BakerHostetler

(57) ABSTRACT

A radiofrequency transmission/reception integrated circuit includes at least one radiofrequency signal amplifier (PA, LNA), the at least one amplifier being configured, in operational mode, so as to perform a function of amplifying a radiofrequency signal applied at input, wherein the amplifier is configured so as to perform an oscillator function in a self-test mode of the integrated circuit, to generate a radiofrequency signal on at least one of the input or the output of said amplifier. A self-test method for such an integrated circuit is also provided.

17 Claims, 10 Drawing Sheets

(56) References Cited

U.S. PATENT DOCUMENTS

2016/0211813 A1 7/2016 Gonzalez Jimenez

OTHER PUBLICATIONS

Ballot, et al., "Built-in Oscillation-Based Testing of RF Amplifier Gain using Differential Power Detection", 2019 IEEE Radio and Antenna Days of the Indian Ocean (RADIO), pp. 1-2, Sep. 23, 2019.

Goyal, et al., "A self-testable SiGe LNA and Built-in-Self-Test methodology for multiple performance specifications of RF amplifiers", Thirteenth International Symposium on Quality Electronic Design (ISQED), Mar. 19, 2012.

Ayari, "Indirect Analog / RF IC Testing : Confidence Robusteness improvments", University of Montpellier II (HAL Id: tel-00998677, https://tel.archives.ouvertes.fr/tel-00998677, Dec. 12, 2013.

Larie, et al., "A 1.2V 20 dBm 60 GHz Power Amplifier with 32.4 dB Gain and 20 % Peak PAE in 65nm CMOS", European Solid State Circuits Conference (ESSCIRC), 2014 IEEE, Sep. 22-26, 2014.

Shaeffer, et al., "A 1.5-V, 1.5-GHz CMOS low noise amplifier," IEEE Journal of Solid-State Circuits, vol. 32, No. 5, pp. 745-759, May 1997.

Sowlati, et al. "A 2.4 GHz 0.18 /spl mu/m CMOS self-biased cascode power amplifier with 23 dBm output power", 2002 IEEE International Solid-State Circuits Conference, Digest of Technical Papers (Cat. No. 02CH37315), pp. 294-467, vol. 1, 2002.

Gorisse et al., "A 60 Ghz CMOS RMS Power Detector for Antenna Impedance Mismatch Detection", Northeast Workshop on Circuits and Systems, Jun. 2008.

Chung, et al., "A 0.001-26 GHz Single-Chip SiGe Reflectometer for Two-Port Vector Network Analyzers", 017 IEEE MTT-S International Microwave Symposium (IMS), pp. 1259-1261, 2017.

\* cited by examiner

RADIOFREQUENCY INTEGRATED CIRCUIT AND CORRESPONDING TEST METHOD

CROSS-REFERENCE TO RELATED APPLICATIONS

This application claims priority to foreign French patent application No. FR 1911797, filed on Oct. 22, 2019, the disclosure of which is incorporated by reference in its entirety.

FIELD OF THE INVENTION

The invention relates to the in-situ testing and characterization of radiofrequency transmission and/or reception integrated circuits, and more particularly integrated circuits that form the front circuitry portion or "front end", which comprises at least the low-noise amplifier, which is the first reception path input stage, and/or the power amplifier, which is the last output stage of the transmission path, and which are the stages coupled to the antennas. The invention applies notably, but without limitation, to the testing of front-end modules produced for the field of communications in the millimetre band (typically from 6 to 100 GHz), for consumer applications based on the interoperability of communicating objects (motor vehicles, the home, the food industry, medicine).

BACKGROUND

The invention more particularly addresses the architectures of communication terminals in which the radiofrequency analogue electronics portion that is coupled to the antennas is formed by integrated circuits, called front-end modules, one per antenna, which are joined to one or further integrated circuits in order to form the complete chain of the transmission/reception paths between a signal-processing processor and antennas. This design makes it possible to optimize the cost and the size of the terminal as best possible with respect to the needs of an application, notably while allowing the use of different technologies in accordance with the integrated circuits. For example, depending on the required free-space transmission range, more or less power will be required, thereby dictating the number of front-end modules and antennas to be used, depending on the semiconductor technology that is used. Typically, with AsGa or GaN technologies, which exhibit good performance for amplifying radiofrequency signals, significantly fewer antennas will be used than in the case of CMOS technology, but at a significantly higher cost.

To reduce the cost and the size of front-end modules using AsGa technology, it is proposed for example to primarily integrate, into these modules, only the power electronics portion for which it exhibits especially good performance, and the other radiofrequency electronic functions are produced using a technology that is less expensive in terms of integration density and manufacture (CMOS, FinFET for example). When the cost of the module is not a major issue, or when the module is produced using a less expensive technology, these front-end modules may incorporate other radiofrequency electronic functionalities, such as filtering functions, or frequency transposition functions are moved to the primary electronic circuit, which already contains all of the baseband electronics, or even to other intermediate integrated circuits.

Now, taking for example (free-space) transmission ranges greater than a few tens of centimetres, it is necessary to use a large number of antennas, of the order of several hundred, and up to one thousand, depending on the semiconductor technology that is used, to provide the necessary power. At high frequencies (greater than approximately 10 GHz), it is also necessary to have a high antenna gain; one way of achieving this is to use an antenna array comprising a large number of elementary antennas.

The ability to test these front-end modules in a high volume is thus a major issue for consumer applications. The portion of the testing cost in the total cost of a terminal should be reduced as far as possible. This testing issue arises for the manufacturer of the circuit, but also for the final assembler (who is not necessarily the manufacturer of the chosen front-end modules).

In the general field of the ability to test radiofrequency transmission/reception integrated circuits in a high volume, which involves checking that the transmission and reception performance is in accordance with the specifications of the product, the general tendency is not to perform tests in radiofrequency mode, because this is too constrictive and expensive in terms of test equipment (specific test equipment and/or reference antennas), has an impact on the surface of the integrated circuits to be tested (shielding in order to avoid stray coupling effects with the probes or testing heads) and testing time.

It is sought rather to use what are known as indirect testing solutions, based on digital signals that are easy to generate and to read, which consists notably in integrating test resources into the integrated circuits, these test resources being designed to be combined with the functional resources specific to the integrated circuit under test, in order to allow the analogue chains to be tested. Reference is made to a built-in self-test, denoted by the acronym BIST. For example, the document "Indirect Analog/RFIC testing: Confidence Robustness improvements", thesis by Haithem Ayari, submitted 12 Dec. 2013 at the University of Montpellier II (HAL Id: tel-00998677, "https://tel.archives.ouvertes.fr/tel-00998677") proposes an integrated switch for looping the transmission path back to the reception path, able to be activated in test mode, that makes it possible, based on a digital stimulus of the transmission path, to emulate the complete reception chain with the radiofrequency signal produced at output by the transmission path, and what is analysed is the digital signal obtained at output of the reception path.

These solutions do not address the problem of testing front-end modules whose input and output signals from the transmission and reception paths are high-frequency radiofrequency signals. For these modules, the problem of generating a good-quality radiofrequency test stimulus remains unsolved, because testers are in most cases incapable of generating high-frequency signals, and even if they are, using this test functionality with generation of RF signals is highly expensive. In addition, the above-described BIST solution of looping the radiofrequency output of the transmission path back to the radiofrequency input of the reception path does not make it possible to separately qualify the reception path (gain, noise factor) and the transmission path (gain), unless providing test points in the module for analysing the signals. The problem of using probes or testing heads for radiofrequency signals is encountered.

Lastly, there would be a benefit for the assembler in being able to check, for each front-end module before it is assembled on the printed circuit board of the terminal, that the antenna connection is correct. This check for a "correct" connection between the front-end module chip and its antenna or its antennas is highly important, because the input and output amplifiers will exhibit good performance only if there is good matching of their input or output impedance with the antenna. Now, if this impedance caused by the connection to the antenna is too low (short-circuit to ground connection fault), there will be no or too little output voltage; if this impedance is too high, there will be far too much voltage, with a risk of the amplifiers of the module being destroyed; more specifically, of the transistors of the power amplifier breaking down. This check cannot be performed through an electrical continuity test. It is necessary to check a radiofrequency power level at the output of the output amplifier (power amplifier) as close as possible to the antenna. In the case of a reception path connected to its own antenna (full-duplex mode), this is more complicated, unless a wave is transmitted just upstream of the antenna in order to measure the signal received downstream of the antenna, between the connection pad for connection to the antenna and the input of the low-noise amplifier at the input of the reception path. This would be far too expensive and unsuitable for high-volume testing.

There is therefore a problem in terms of the high-volume testing of front-end modules, without the tester generating a radiofrequency signal, and while performing this at a low cost, without using either reference antennas or expensive specialist equipment or probes or testing heads.

There is therefore a need to find a universal and inexpensive test solution that makes it possible to achieve true economy of scale for high-volume in-situ testing of radiofrequency integrated circuits, which makes it possible to check the state of the antenna connection, and/or which advantageously makes it possible to evaluate the qualities of the transmission path and/or of the reception path as independently as possible from the functional resources of the integrated circuit under test.

SUMMARY OF THE INVENTION

One idea on which the invention is based consists in reconfiguring an amplifier present in a front-end module (low-noise amplifier and/or power amplifier) as an oscillator, notably by activating a positive feedback loop in a controlled manner. The oscillator thus formed generates an RF signal in the operating band of the front-end module, thereby making it possible to test one or more components thereof (other than the amplifier itself) and/or its connection antenna.

As will be explained in detail further on, using a reconfigurable amplifier causes minimum complexity of the electronics of the front-end module, far less than that which would be caused by adding a dedicated oscillator. Admittedly, if the front-end module chips to be tested incorporate a frequency transposition stage (mixer), there is sometimes a local oscillator operating in the useful radiofrequency band. In this case, it would be possible to contemplate an analogue BIST solution for allowing specific use of this local oscillator in test mode, in order to provide a radiofrequency test signal. However, such use would require incorporating transmission paths for transmitting this RF signal to input nodes of the transmission and reception paths close to the antenna connection pad or pads, which is not always possible or desirable. This would also especially absolutely not solve the case for front-end modules that may not comprise local oscillators. The invention does not exhibit such drawbacks.

One subject of the invention for achieving this aim is a radiofrequency transmission and/or reception integrated circuit comprising at least one radiofrequency signal amplifier, said at least one amplifier being configured, in operational mode, so as to perform a function of amplifying a radiofrequency signal applied at input, wherein said amplifier is configured so as to perform an oscillator function in a self-test mode of the integrated circuit, to generate a radiofrequency signal on at least one of the input or the output of said amplifier, characterized in that the integrated circuit is configured, in said self-test mode, so as to allow said radiofrequency signal to propagate in at least one component of said radiofrequency integrated circuit, separate from said amplifier, and in that it also comprises a measuring circuit ($DET_A$) for measuring a signal generated following propagation of said radiofrequency signal in said component of said integrated circuit and representative of at least one characteristic of said component.

The use of reconfigurable amplifiers as oscillators to perform BISTs is known per se, see for example:

M. Saeedeh et al "Oscillation-based Test for Measuring 1 dB Gain Compression Point of Power Amplifiers", IEEE Iranian Conference on Electrical Engineering, 8 May 2018, pages 190-195; and B. Maxwell et al. "Built-in Oscillation-Based Testing of RF Amplifier Gain using Differential Power Detection", IEEE Radio and Antenna Days of the Indian Ocean (RADIO) Radio Society, 23 Sep. 2019, pages 1-2.

In these publications, however, the aim is to test or characterize the oscillator itself, which is disconnected from the rest of the circuit for this purpose. In the case of the invention, on the other hand, the signal generated by the amplifier converted into an oscillator is used to test or characterize other components of the radiofrequency transmission/reception integrated circuit. For example, when the amplifier converted into an oscillator is a low-noise amplifier of a reception path of the integrated circuit, the oscillatory signal thus generated may be used to test or characterize the antenna connection at the input of the amplifier and/or the entire reception chain or even—on the condition of providing looping of an output of the reception path back to a corresponding input of the transmission path—the entire transmission path. Likewise, when the amplifier converted into an oscillator is a power amplifier of a transmission path of the integrated circuit, the oscillatory signal thus generated may be used to test or characterize the antenna connection at the output of the amplifier, a filter or a subsequent amplification stage, or even—on the condition of providing looping of an output of the transmission path back to a corresponding input of the reception path—the entire reception path.

Another subject of the invention is a self-test method for such a radiofrequency integrated circuit, comprising the following steps:

a) configuring a radiofrequency signal amplifier as an oscillator, in order to generate a radiofrequency signal on at least one of the input or the output of said amplifier;

b) propagating said radiofrequency signal in at least one component of said radiofrequency integrated circuit, separate from said amplifier; etc) measuring a signal generated following propagation of said radiofrequency signal in said component of said integrated circuit, and deducing at least one characteristic of said component therefrom.

The invention also relates to a self-test method for a corresponding radiofrequency integrated circuit.

Various embodiments of this circuit and of these methods are the subject matter of the dependent claims.

BRIEF DESCRIPTION OF THE DRAWINGS

The invention will be better understood and other advantages will become apparent upon reading the detailed description of embodiments given by way of example, which description is illustrated by the appended drawing, in which.

DETAILED DESCRIPTION

It is recalled that the figures are simple diagrams illustrating the invention. For the sake of clarity and simplicity, the same notations or references have been used throughout the description and in the figures to denote the same elements or similar elements.

The use of the expressions "able to be reconfigured as an oscillator" or "reconfigured as an oscillator" applied to the input (LNA) and output (PA) amplifiers of the radiofrequency circuits coupled to the antennas should be understood as putting these amplifiers into an operating mode in which, rather than amplifying a signal present at their input, these amplifiers oscillate, that is to say spontaneously generate an alternating signal, for example (but not necessarily) a sinusoidal signal. Typically, reconfiguration as an oscillator is achieved by activating a positive feedback loop by way of a control signal (for example a logic signal).

The term "connected" indicates a direct electrical connection; and the term "coupled" indicates a connection that may be direct or indirect, through at least one intermediate component.

The term "component" denotes any passive or active functional block of the radiofrequency integrated circuit, such as an amplifier, a filter, a mixer, etc. or even simply a connection pad for connection to an external element such as an antenna or another integrated circuit.

Radiofrequency (RF) denotes a signal having a centre frequency of at least 1 MHz. In general, a radiofrequency signal comprises at least one carrier modulated by an envelope, which is generally complex, whose spectrum has a maximum frequency far lower than that of the carrier. Hereinafter, "low-frequency" (LF) is understood to mean a frequency lower than the frequency of the envelope by at least a factor of 10; this is therefore a relative concept. A "low-frequency characteristic" of an RF signal is therefore a property of its envelope.

In the figures, the symbology of the transistors corresponds to that of field-effect transistors using N-channel CMOS technology. A person skilled in the art knows how to make the transpositions (power supplies) to other types of field-effect transistor (P-channel, or using other semiconductor technologies such as advanced CMOS technologies (FinFET) or GaN, AsGa, SiGe technologies).

Figure 1:
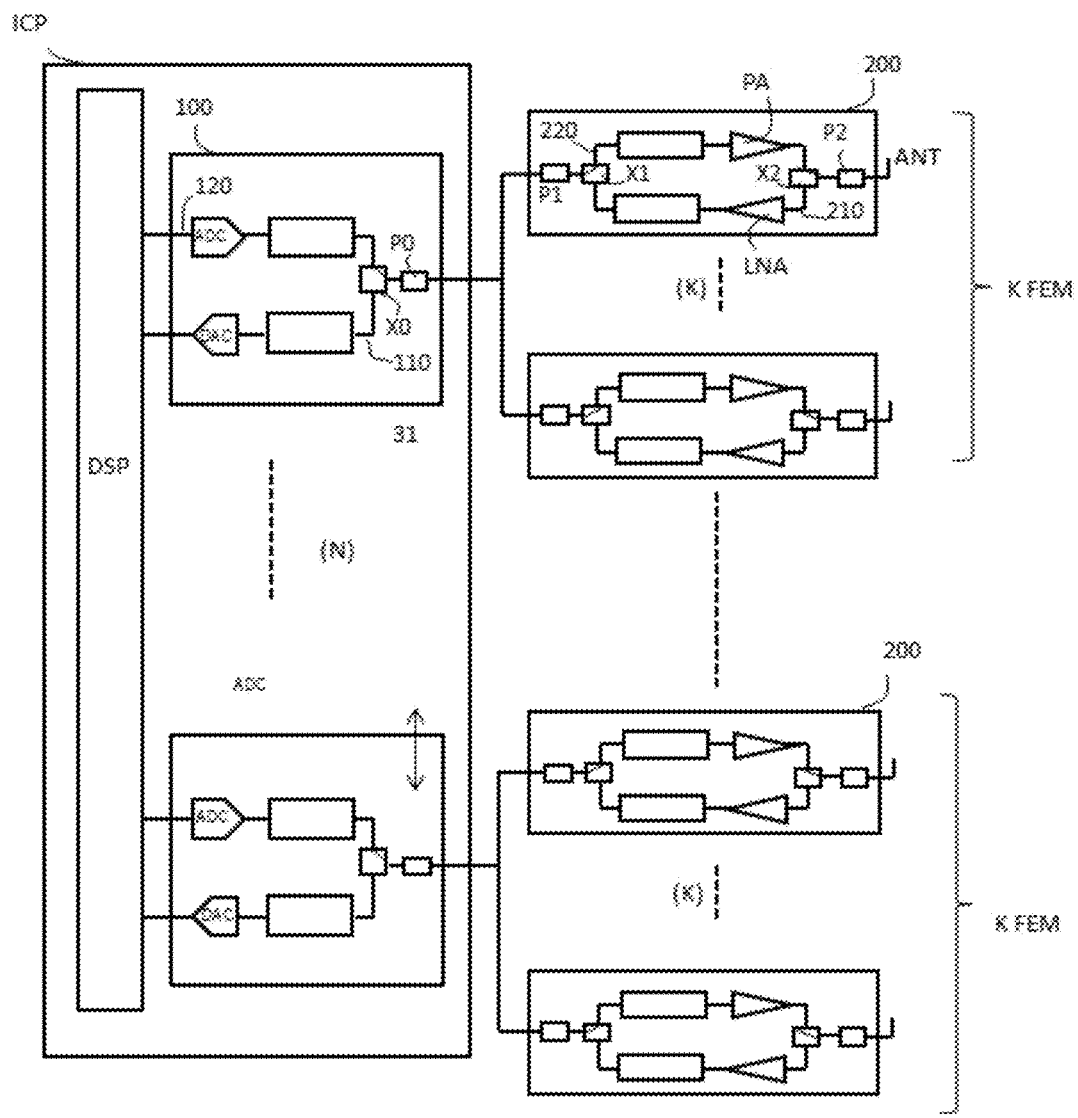
FIG. 1 is a block diagram of one example of a communication terminal in the millimetre band, comprising radiofrequency front-end modules coupled to respective antennas, joined to a primary integrated circuit performing baseband or low-frequency analogue and/or digital processing.

A communication terminal intended more specifically for the millimetre band is illustrated schematically as an example in FIG. 1. In the example, this is a terminal of the type with an N-path directional beam, with carrier phase offset control, coupled to N groups of K antennas, one group per path. According to the antenna technology used for the application, the term "antenna" may denote one antenna element or a plurality of antenna elements in an array.

In the example, the terminal comprises a primary integrated circuit ICP and N×K front-end modules 200 each coupled to a respective antenna ANT. The integrated circuit comprises a signal-processing processor DSP driving N transmission/reception stages 100, which each drive K front-end modules 200. This architecture with K module/antennas per path makes it possible to meet the power requirements of the application.

Each front-end module 200 comprises, between a first I/O connection pad P1 for connection to the primary integrated circuit ICP and a connection pad P2 for connection to a respective antenna ANT:

a radiofrequency transmission path 220 comprising at least one power amplifier PA (also called output amplifier hereinafter), whose output is coupled to the antenna pad P2 via a path switch X2;

a radiofrequency reception path 210 comprising at least one low-noise amplifier LNA (also called input amplifier hereinafter), whose input is coupled to the antenna pad P2 via the antenna switch X2.

The two radiofrequency transmission and reception paths are connected respectively at input and output to the pad P1 via another path switch X1.

Other radiofrequency analogue functions may be integrated into the front-end module, depending on the semiconductor technology and/or the communication technique.

It is notably possible to have adjustable-gain amplifiers, phase shifters or filters or mixers associated with a local oscillator. The list is nonlimiting. These functions may however also be moved to the primary integrated circuit ICP, as illustrated in FIG. 1, or to intermediate integrated circuits. In this case, the front-end module essentially comprises the input amplifier of the radiofrequency reception path (low-noise amplifier LNA) and the output amplifier of the radiofrequency transmission path, coupled on one side to an antenna connection pad, which is shared in the example, and on the other side to an I/O signal pad, also shared, for connection to the primary integrated circuit. It is then possible to design the module optimally in terms of surface area and radiofrequency amplification performance (gain, noise (LNA), linearity (PA) depending on the semiconductor technology that is used).

In the example, the primary integrated circuit ICP comprises a signal-processing processor DSP that performs processing operations in baseband for the N paths, including for example the modulation/demodulation functions when these are digital (for example phase-quadrature modulation), and which drives in parallel N transmission/reception paths 100, which comprise the analogue⇔digital conversion stages DAC and ADC, frequency transposition stages (mixers TF and local oscillators OL), and input and output amplification stages. For each block, a path switch X0 makes it possible to couple the transmission path output 110 or the reception path input 120 to a corresponding I/O interface pad P0. This pad P3 is coupled, via an array of interconnection conductors of the terminal, to the pads P1 of the M associated radiofrequency circuits.

The present invention does not relate to any particular communication technique or to a specific terminal architecture, but to the ability to perform in-situ self-testing of such front-end modules 200 for such a radiofrequency communication terminal. A person skilled in the art will know how to apply the invention that will now be described to the various communication techniques that are used.

In the invention, at least one amplifier out of the input amplifier LNA and/or the output amplifier PA of the front-end module is an amplifier able to be reconfigured as an electronic oscillator on command in order to produce a radiofrequency sinusoidal signal. If the front-end module has been designed to transmit/receive in what is called the 60 GHz frequency band, this corresponding in practice to carrier frequencies situated between 57 and 66 GHz, the frequency of the sinusoidal signal generated by self-oscillation of the amplifier will be in this frequency band, for example around 62 GHz.

A high-frequency sinusoidal signal is thereby obtained on the signal transmission line between the amplifier reconfigured as an oscillator and the antenna connection terminal P2 of the module. Depending on the amplifier typology and more particularly on its structure when it is configured as an oscillator, the sinusoidal signal provided by the oscillator may be present on the input and/or the output of the amplifier. Furthermore, the sinusoidal signal may be present on the input and the output of the amplifier reconfigured as an oscillator, with very different power levels.

More precisely, with regard to the low-noise reception amplifier, the first stage of this amplifier, which is the one whose input is coupled to the antenna connection pad (directly or indirectly via a transformer in the case of a differential amplifier; and/or a path switch in the case of a half-duplex module and/or an antenna filter), is preferably able to be reconfigured as an oscillator, notably if it is desired for the sinusoidal signal to be transmitted on the side of the antenna. It is not essential for the other stages of the amplifier (generally including at least two for the applications we are dealing with) to be able to be reconfigured (even though this may be contemplated). Reconfiguring the first stage of the amplifier as an oscillator should allow the sinusoidal signal to propagate to the rest of the reception chain if it is desired to propagate an RF signal in this direction in order to perform a test.

The sinusoidal signal thus generated is used in the invention as test signal to check the antenna or else as a signal for the radiofrequency calibration of the transmission path, or else as a signal for the radiofrequency calibration of the reception path, as will be explained.

Figure 2:
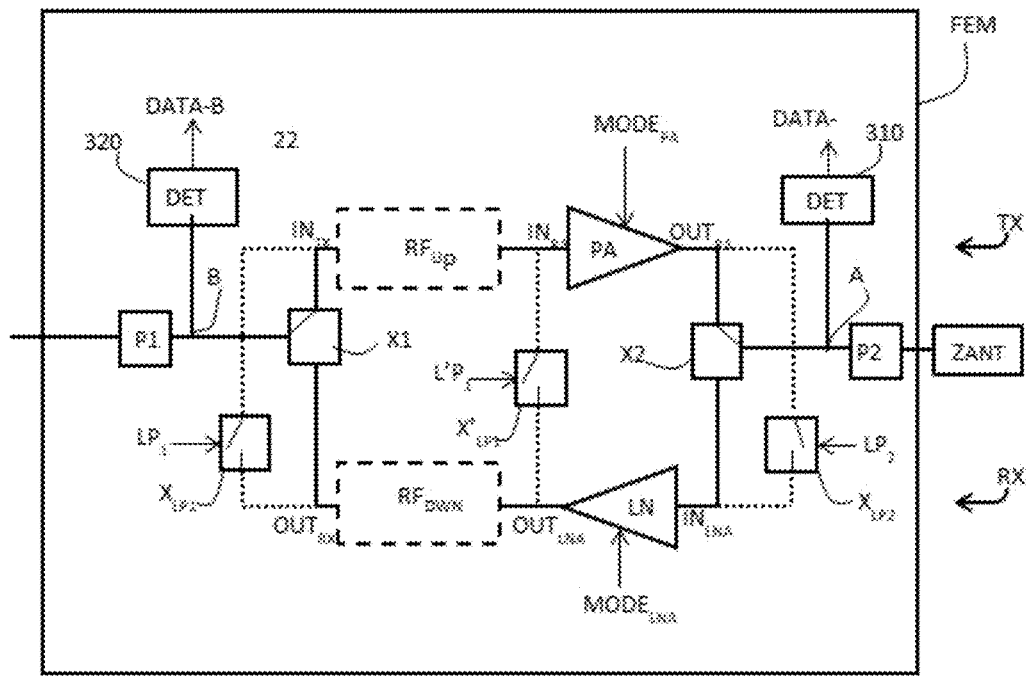
FIG. 2 is a block diagram of a front-end module for a half-duplex communication mode incorporating test resources according to the invention, according to a first mode of implementation of the invention.
Figure 7:
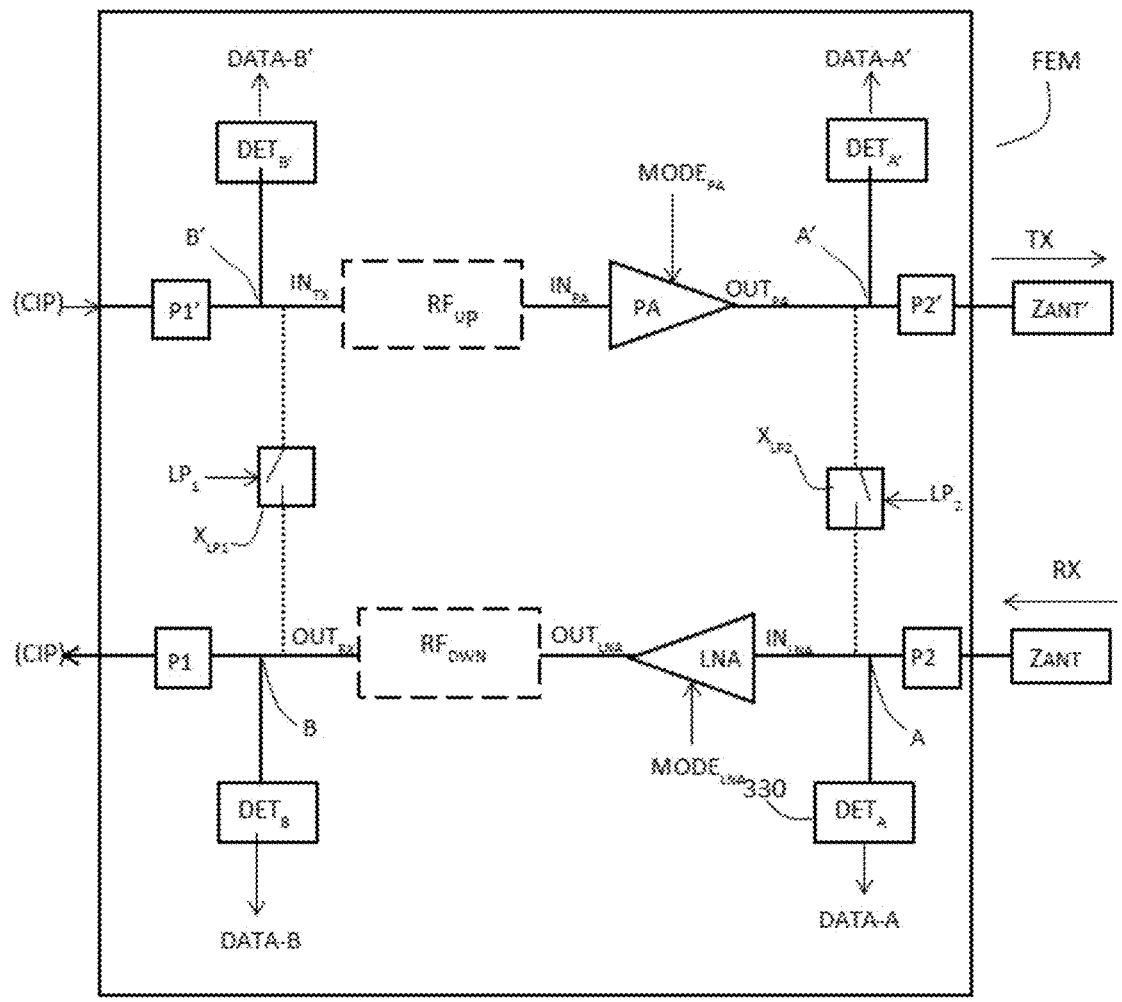
FIG. 7 illustrates a block diagram of a front-end module for a full-duplex communication mode, incorporating test resources according to the invention corresponding to a second mode of implementation of the invention.
Figure 8:
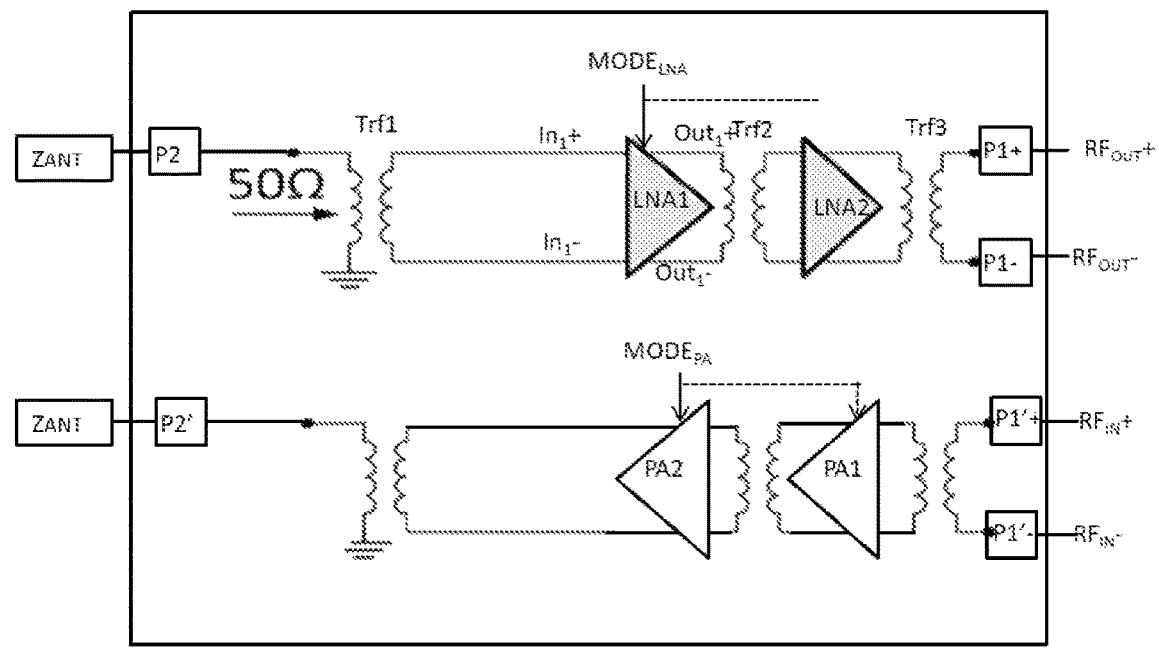
FIG. 8 illustrates a differential-pair topology of a low-noise amplifier LNA and of a power amplifier PA able to be used in the front-end module of FIG. 6.

It should be noted that FIGS. 2, 7 and 8 are essentially explanatory diagrams that do not take into account various electronic implementation choices (for example differential or non-differential signal) or technical switching choices (for example phase-quadrature digital modulation) for a given module. In the remainder of the description, an explanation will be given where necessary of how the various technical aspects are taken into account for the practical implementations of the invention.

FIG. 2 is a block diagram of a front-end module FEM illustrating one embodiment of the invention. In the example, the module FEM is designed for a half-duplex communication mode. It comprises a single connection terminal P2 for connection to an antenna ANT associated with a path switch X2, and a single signal input/output terminal P1, which forms the interface with the baseband processing electronics (CIP, FIG. 1).

The radiofrequency reception path RX comprises a low-noise amplifier LNA whose signal input $IN_{LNA}$ is coupled to the antenna pad P2 via the switch X2 in reception mode RX, and may or may not comprise downstream electronic circuitry $RF_{DWN}$. When it is present, this circuitry $RF_{DWN}$ has a topology that depends on the communication mode or modes implemented. By way of nonlimiting example, this circuitry $RF_{DWN}$ may comprise: a frequency mixer associated with a local oscillator in order to transpose into baseband the radiofrequency signal $OUT_{LNA}$ that is delivered at output by the amplifier LNA, followed by a baseband filter and an automatic gain control circuit. The reception path output signal $OUT_{RX}$ is applied to the I/O pad P1 of the module via the switch X1.

The radiofrequency transmission path TX comprises a power amplifier PA whose output is coupled to the antenna pad P2 via the switch X2 in transmission mode TX, and which may or may not comprise upstream electronic circuitry $RF_{UP}$, not described, which would have where necessary a topology corresponding to the requirements of the application, dual with that of the circuitry $RF_{DWN}$ of the reception path. In the example, it could thus comprise: a baseband filter followed by a frequency mixer with a local oscillator, providing the radiofrequency signal $IN_{PA}$ at input of the power amplifier.

The exact configuration of this circuitry $RF_{DWN}$ and $RF_{UP}$ is not essential to the invention, and other configurations are possible. For example, in a phase-quadrature digital modulation/demodulation topology I, Q, the circuits $RF_{DWN}$ and $RF_{UP}$ would each have two identical branches, one per quadrature, with a local oscillator providing two local oscillator signals in quadrature, one for each branch, and would be coupled respectively at output and at input to two I/O signal pads, corresponding to the two signals I and Q (not illustrated).

The low-noise amplifier LNA and/or the power amplifier PA each have two possible operating modes: an operational mode, in which the amplifier performs its amplification function, and a test mode, in which it is reconfigured as an oscillator and has a function of generating an RF sinusoidal signal able to be used as test or calibration RF signal. The operating mode is defined by the logic state of a respective control signal MODE-LNA and MODE-PA. For example, the test mode corresponds to a logic state at "1". The state of these signals is typically configured by test equipment, via a serial interface port (SPI or I2C bus or the like) of the integrated circuit, in a volatile memory (a register) of the integrated circuit.

Also, according to one embodiment, the module comprises at least one detection circuit DET-A for detecting a characteristic of a radiofrequency signal, which is measured in the example at a point of the RF transmission line between the switch X2 and the pad P2. This detection circuit is an integrated test resource of the module, used to measure a characteristic of the RF sinusoidal signal generated by one or the other of the amplifiers LNA and PA in test mode. A measured characteristic corresponds for example to a low-frequency (LF) characteristic, such as a characteristic current value, voltage value or power value of the LF envelope of the RF signal. This detection circuit is typically designed to have a high input impedance in order to draw little power. In other words, losses caused by insertion are limited or virtually zero. According to one embodiment, this circuit comprises an analogue-to-digital converter, so as to provide at output an item of digital data DATA-A which is a measure of the sought characteristic. Since what are sought are resources that are simultaneously inexpensive in terms of surface area, easy to implement in an RF analogue electronics context and capable of providing a sufficiently stable and accurate measurement, use is preferably made of a peak voltage detector rather than a current detector. This choice is also prudent, since front-end modules often incorporate such peak voltage detectors in order to perform power control (legal requirement to comply with transmission power standards), such that the resource is already present and able to be used for the requirements of the invention.

Figure 3:
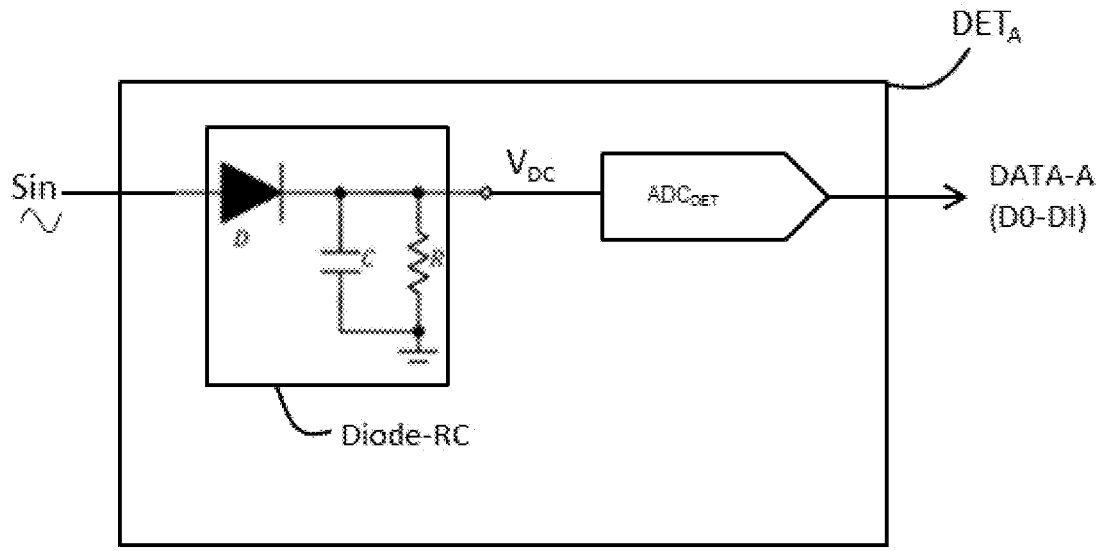
FIG. 3 illustrates one exemplary embodiment of means for analysing a sinusoidal signal LF characteristic (peak voltage) able to be used in the invention.

FIG. 3 illustrates, by way of nonlimiting example, one embodiment of a particularly simple circuit $DET_A$ for measuring a peak voltage amplitude. It is based on a diode-RC peak voltage detection circuit, whose time constant is matched in practice to the frequency of the sinusoidal signal to be detected, so as to provide a constant output voltage $V_{DC}$ (the capacitor does not have time to discharge between two peaks). Such a diode-RC circuit is able to be integrated very easily without disrupting the operational or test operation of the radiofrequency module.

The diode-RC circuit is advantageously followed by an analogue-to-digital converter $ADC_{DET}$ that provides, at output, a digital value DATA-A that represents the peak voltage amplitude, coded on a few bits D0-DI; this item of data may be stored in a volatile memory (register) associated with the serial interface of the module. The number of resolution bits may be adapted on the basis of the desired measurement accuracy, depending on the phase or the test specifications, as will be explained below. In practice, the converter may be specific to the measuring circuit or a common (shared) resource integrated into the module.

The circuit $DET_A$ forms an integrated test resource of the module FEM (BIST) that makes it possible, when one of the amplifiers PA or LNA is reconfigured as an electronic oscillator, to perform an antenna connection self-test, when the antenna pad is connected to an antenna or an equivalent impedance load, as will be described below.

Other test resources may advantageously be provided, allowing the implementation of other self-test sequences for qualifying the transmission and reception paths of the module (in terms of gain and/or in terms of noise), on the basis of the sinusoidal signal generated by one of the amplifiers and used as RF calibration signal. The module FEM shown in FIG. 2 thus comprises a first path loopback switch $X_{LP1}$, able to be activated in test mode, for looping an output of the reception path back to a corresponding input of the transmission path, and a second detector circuit DET-B for detecting a signal characteristic, placed close to the I/O pad P1. In the example illustrated, the loopback switch $X_{LP1}$ makes it possible to loop the output $OUT_{RX}$ of the downstream electronic circuit $RF_{DWN}$ back to the input $IN_{TX}$ of the upstream electronic circuit $RF_{UP}$. Other installations may be contemplated. For example, it may be desired specifically to check the characteristics of the amplifiers LNA and PA: it is possible to provide a loopback switch $X'_{LP1}$ configured so as to loop the output $OUT_{LNA}$ of the amplifier LNA back to the input $IN_{PA}$ of the power amplifier PA. In this case, it is also necessary to provide a measurement means for measuring an LF characteristic of the signal at output $OUT_{LNA}$ or at input $IN_{PA}$. Depending on the modules, it is thus possible to have one or more loopback options for qualifying the paths in more or less detail. In the figure, the loop path of these various switches $X_{LP1}$, $X'_{LP1}$ and $X_{LP2}$ has been shown in dashed lines in order to highlight that these are integrated test resources provided for the self-testing of the module according to the invention. These resources are not involved in operational mode: they are not activated and are designed not to induce RF losses.

Figure 4:
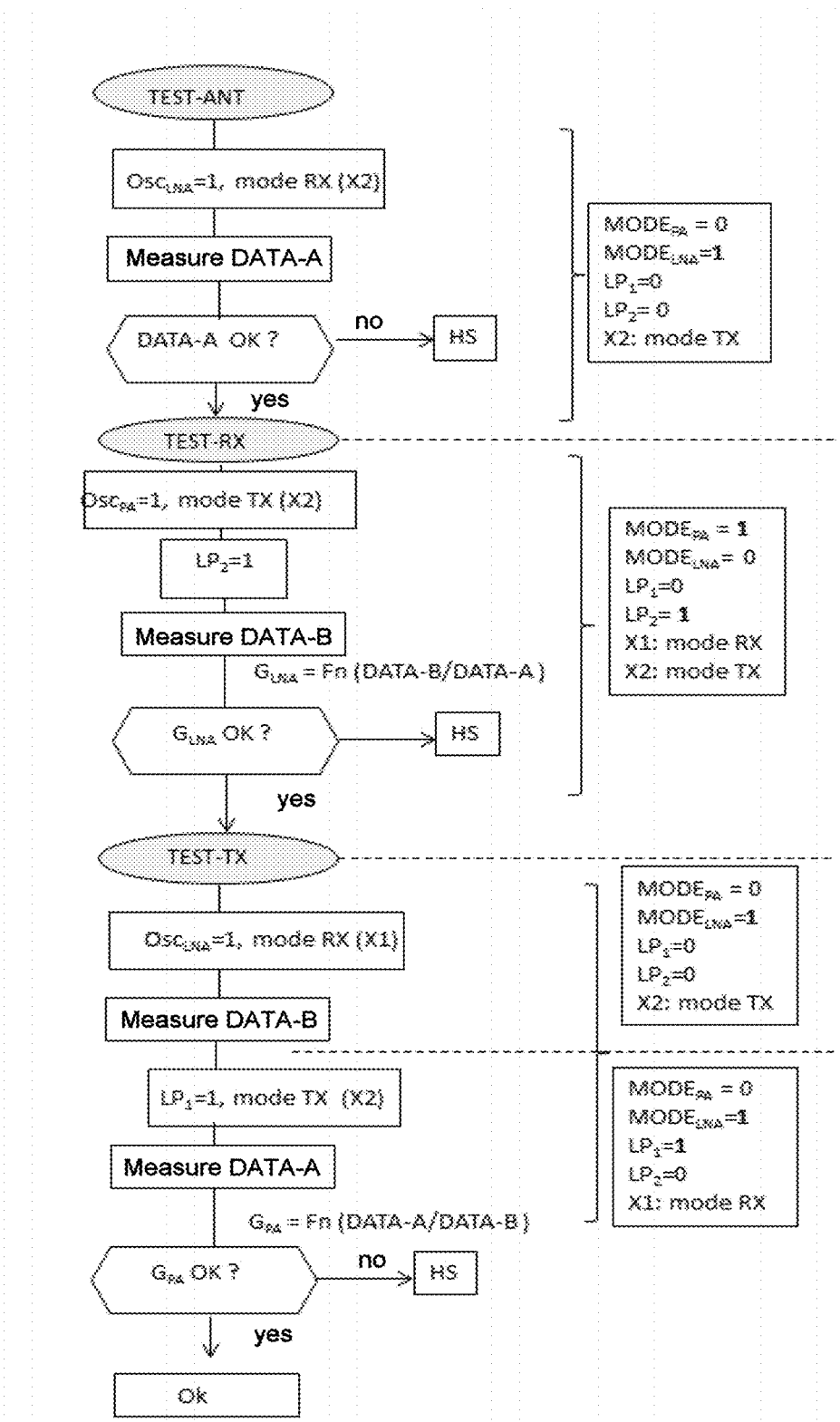
FIG. 4 is a flowchart of a corresponding self-test method.

These various integrated test resources according to the invention make it possible to perform a self-test sequence of the integrated circuit FEM, in order to check an antenna connection, and/or evaluate the gain and/or the noise of the radiofrequency reception path (or of the low-noise amplifier), and/or evaluate the gain of the radiofrequency transmission path (or of the power amplifier). More precisely, a self-test sequence according to the invention will preferably comprise, as illustrated in FIG. 4, an antenna connection test step TEST-ANT; then, if this antenna connection is validated (correct impedance matching), a test step, TEST-RX, of testing the reception path RX of the module, comprising at least one measurement of the gain (and possibly of the noise) of the reception path and/or of the low-noise amplifier LNA, on the basis of the sinusoidal signal transmitted by the power amplifier PA reconfigured as an oscillator used as RF calibration signal; then, if the reception path RX is validated (correct gain), a test step, TEST-TX, of testing the transmission path TX of the module by measuring the gain of the reception path and/or of the power amplifier, on the basis of the sinusoidal signal transmitted by the low-noise amplifier LNA reconfigured as an oscillator, used as RF calibration signal.

The various steps of a self-test method according to the invention will be explained below, applied as an example to a front-end module in half-duplex mode, corresponding to the explanatory block diagram of FIG. 4.

STEP OF CHECKING THE ANTENNA CONNECTION, TEST-ANT

For this check, the antenna connection terminal P2 is coupled or joined to an antenna, or else to an equivalent load $Z_{ANT}$ equivalent to the antenna used in the destination product (terminal) using any appropriate technique. Depending on the antenna type and depending on the technique for joining the module to the antenna, it may be advantageous or easier to use a simple equivalent load impedance for the test. Common values of this impedance are 50 or 75 ohms.

With the module FEM under test being supplied with power, conventional test equipment activates the functional test mode of the amplifier LNA or the amplifier PA, allowing it to be configured as an electronic oscillator. In the example, it is the amplifier LNA that is reconfigured: the test equipment uses the serial interface of the module to position a logic state, "1" in the example, of the control signal MOD-$E_{LNA}$ in a memory register, and the switch X2 is configured in reception mode RX (FIG. 2). An RF sinusoidal signal is obtained at input $IN_{LNA}$ (and also at output $OUT_{LNA}$), whose characteristics (for example the LF characteristics of the envelope: current, voltage, power) depend on the antenna load impedance seen by the oscillator (amplifier LNA). In the example of a peak voltage detector $DET_A$ (FIG. 3), the measured peak voltage value is a linear function of the antenna load impedance.

Figure 5:
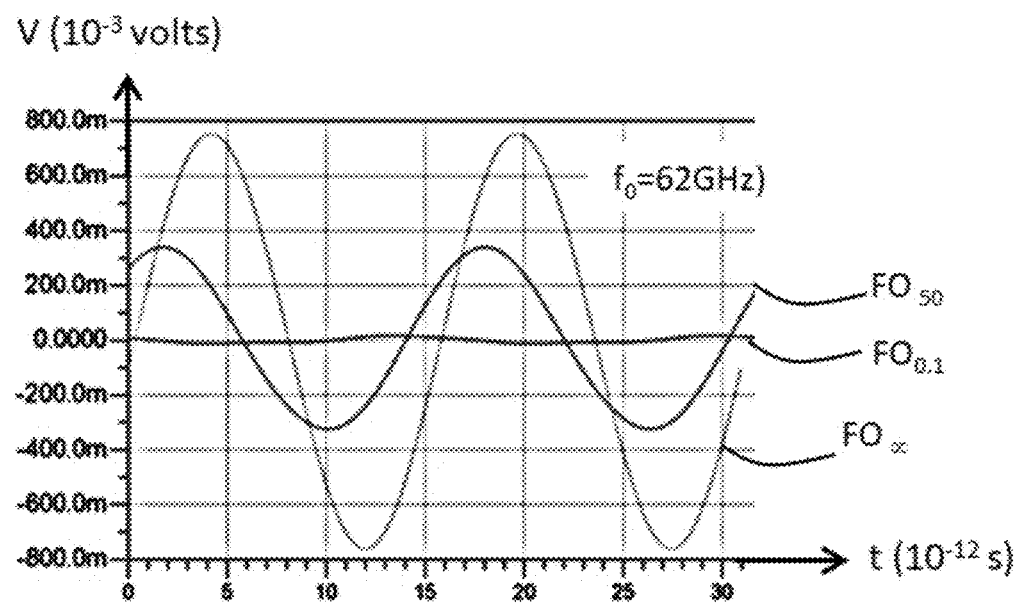
FIG. 5 shows the variation in the waveform of a sinusoidal signal $Sin_{RF}$ generated by an amplifier reconfigured as an electronic oscillator according to a principle of the invention, as a function of the load impedance of the amplifier.

FIG. 5 illustrates this. It shows waveforms of the sinusoidal signal $Sin_{RF}$ as a function of an output load impedance representative of an antenna load. These waveforms were obtained through simulation, using a circuit diagram of a low-noise amplifier LNA designed for a communication terminal for what is called the 60 GHz band and for antenna impedances of 50 ohms. In the example, this is a differential-pair amplifier with inductive degeneration, which is shown schematically in FIG. 8. It comprises two amplification stages LNA1 and LNA2, and stage LNA1, which is the input stage, coupled to the antenna connection pad P2, has been reconfigured as an oscillator according to the principle of the invention. A more detailed explanation as to how this reconfiguration may be achieved will be given with reference to FIGS. 8 to 10.

For the purposes of the simulation, a variable-impedance load was coupled to an antenna pad coupled at input of this stage LNA1. The waveforms obtained correspond well to a sinusoidal signal of frequency $f_0$ around 62 GHz (period of approximately 16 picoseconds), corresponding to the resonant frequency of the LC tuning circuit of the amplifier used, in the useful band of the module (60 GHz band). The waveform $FO_{50}$ was obtained with a nominal-load impedance of 50 ohms, and has a peak voltage of the order of 300 millivolts, as expected. The waveform $FO_{0.1}$ obtained with a very low load impedance of the order of 0.1 ohms, simulating a short circuit to ground, has a peak voltage of virtually zero. The waveform $FO\infty$ obtained with a very high load impedance, of the order of $5.10^9$ ohms, simulating an open circuit with infinite load impedance, has a peak voltage greater than 700 millivolts, which may in some cases be too high and damage the integrated circuit.

Figure 6:
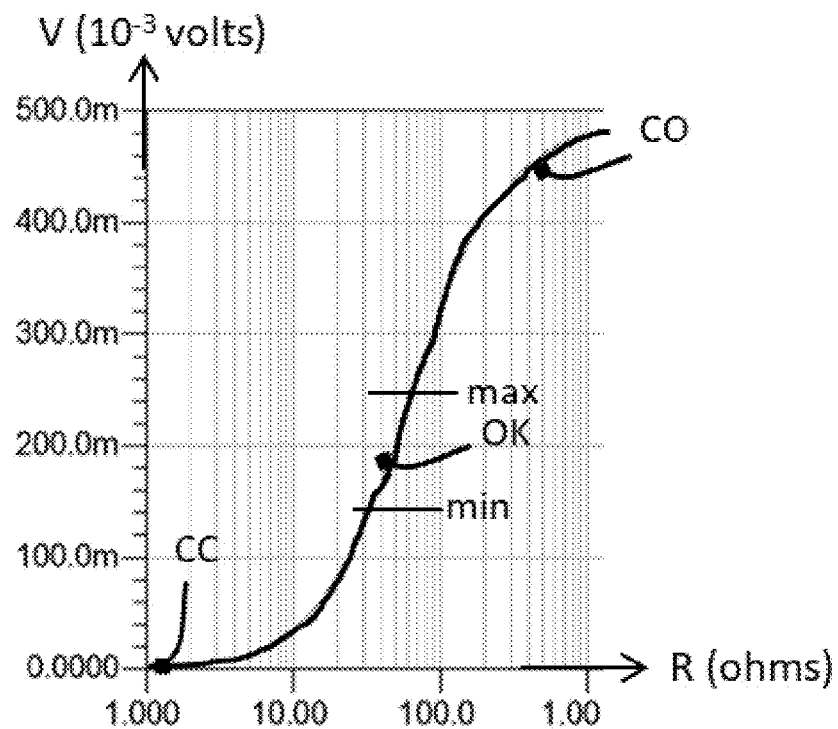
FIG. 6 illustrates a principle of detecting the state of the antenna connection of a front-end module according to the invention, based on this variation in sinusoidal signal waveform with load impedance.

The curve of FIG. 6 highlights the linear variation of peak voltage with the load impedance. 3 points of the curve notably correspond respectively to:

OK, a correct antenna connection state, corresponding to a load impedance around 50 ohms in the example, CO, an open circuit connection fault, corresponding to a load impedance of the order of $5.10^9$ ohms in the example;

CC, a short-circuited to ground circuit fault, corresponding to a load impedance of the order of 0.1 ohms in the example.

It is therefore easily possible to use this linear function to determine an antenna connection state. It is notably possible to take the average of a peak voltage detector measuring the peak voltage of the sinusoidal signal on the signal line between the amplifier reconfigured as an oscillator and the antenna pad P2 (FIGS. 3 and 4). A diode-RC circuit is particularly beneficial because it is easy to integrate, but it is possible to contemplate more complex measuring circuits.

It is also possible to choose to measure another LF characteristic, and link the measurement similarly to an antenna load.

The other aspect of this measurement is that it is a digital measurement that is easy to recover using the test equipment, via the serial interface of the module. Use is made in practice of a converter $ADC_{DET}$ calibrated for a voltage range determined for the module under consideration on the basis of the amplifier (technology, structure) and the DC bias conditions of the amplifier. It is seen for example that the DC bias conditions of the amplifier that are used for the simulation differ between FIG. 5 and FIG. 6, this being expressed by a maximum different peak voltage excursion: of the order of 800 millivolts in one case (FIG. 5), 500 millivolts in the other (FIG. 6).

This converter provides an item of data DATA-A on a number of bits that depends on the desired accuracy: with more resolution bits, it is possible to define a narrower range (values min and max) around a nominal peak voltage value, 180 millivolts in the conditions of FIG. 6 for example, corresponding to an antenna connection state that is correct. It is easily possible to obtain the desired information (OK) depending on the value of the bits of the item of data DATA-A, for example by way of a small settable logic circuit (a few logic gates). Also, if it is desired only to discriminate between two states (OK, not OK) or three states (OK, CO, CC), a great deal of accuracy is not necessarily required, and it is possible to configure the converter with a low resolution, four resolution bits for example, and depending on whether or not the information contains the type of fault, the result of the test is coded on 1 or 2 bits. All this results in a shorter test duration and a data flow at the end of the test that is reduced to one or two bits per module, reducing the read time for the test equipment (serial interface).

The invention thus makes it possible to qualify the antenna connection state of each of the radiofrequency circuits under test easily and at a low integration cost (reconfiguration as an oscillator, detector, converter) with a low test data flow (a few bits per module), which is highly favourable to high-volume testing.

In practice, and as indicated above with regard to the simulations of FIGS. 5 and 6, the test phase should be performed nondestructively, that is to say without risking reaching the breakdown voltage levels of the transistors of the amplifier in the event of an open-circuit fault. To this end, provision is advantageously made for appropriate setting of the DC bias conditions (DC bias current and/or voltage) of the amplifier reconfigured as an oscillator. It is known how to do this easily via the serial interface. These setting options are generally already provided at least for the power amplifier of the transmission path TX (control of the output power).

It should be noted that it is readily possible to use the power amplifier PA reconfigured as an oscillator with a switch X2 in transmission mode TX (FIGS. 2 and 4) to perform this test phase TEST-ANT, with DC bias conditions of the amplifier PA that are appropriate so as not to risk breakdown. Moreover, in the case of a full-duplex front-end module as illustrated schematically in FIG. 7, with respective antenna pads for reception (P2) and for transmission (P'2), two sequences TEST-ANT will then be performed, one with the amplifier LNA reconfigured as an oscillator in order to test the reception antenna connection, and the other with the amplifier PA reconfigured as an oscillator in order to test the transmission antenna connection.

If the antenna connection is incorrect (not OK), the circuit under test is rejected. If it is correct (OK), the test equipment is able to pass to the following test step, TEST-RX.

STEP OF TESTING THE RECEPTION PATH RX OF THE MODULE, TEST-RX.

In this step, the power amplifier PA is used as calibration radiofrequency signal generator, by reconfiguring it as an electronic oscillator (MODE$_{PA}$ at "1"), in order to obtain a sinusoidal signal at a frequency f0 in the useful band of the amplifier. Since the antenna connection has been tested, the peak voltage excursion of this signal is within a nominal voltage range, without a risk of breakdown for the transistors. It may however be beneficial to adjust the DC bias conditions (current and/or voltage) of the power amplifier in this phase as well, in order to limit the power of the RF calibration signal for the purpose of limiting the design constraints on the loopback lines (including loopback switches). It is then possible to reduce the surface impact of integrating these test resources into the module. Use is preferably made of the detection circuit DET$_A$ (switch X2 in transmission mode TX) to measure at least one LF characteristic (peak voltage in the example) of this RF calibration signal under the test conditions (notably temperature).

This calibration RF signal is then injected at input IN$_{LNA}$ of the amplifier LNA of the reception path RX, by activating the loopback switch X$_{LP2}$ (LP$_2$ at "1"). It is then possible to measure the same LF characteristic of the signal at output OUT$_{RX}$ of the reception path, by way of the detection circuit DET$_B$ (similar to the circuit DET$_A$) (switch X1 in reception mode), which provides a corresponding item of digital data DATA-B. The circuit DET$_B$ is similar to the circuit DET$_A$.

The ratio DATA-B and DATA-A for the DC bias conditions of the amplifier LNA and the RF calibration signal gives gain information. It should be noted that it is also possible to vary the DC bias conditions of the amplifier LNA in order to obtain a plurality of measurements. The test equipment is then able to determine whether the amplifier LNA is in accordance with the specifications with regard to the gain.

When designing the module, it is easily possible to make provision to use the same converter ADC-A to provide the measurements DATA-A and DATA-B. It is also possible to set the resolution of the converter or converters (for example 8 bits rather than 4) according to the desired accuracy for the gain measurement.

It is advantageously possible to provide a noise measurement (noise factor or signal-to-noise ratio). In this case, at least one spectral analysis of the signal obtained at the output of the reception path is also provided. In oscillator mode, the frequency of the generated signal may generally be controlled by modifying the value of a capacitance of a resonant circuit of the amplifier, which capacitance may for example be implemented in the form of a varactor (variable capacitance). This allows the oscillator to be frequency-controlled in a certain band. At the output of the receiver P1, a spectrum analyser makes it possible to measure the amplitude of the signal transmitted by the oscillator for each frequency configuration (gain in the band) and the noise floor of the receiver, returned to baseband. This operating mode makes it possible to avoid the cumbersome use of a noise diode connected at the input of the receiver P2. Next, if the characteristics of the reception path (and/or of the amplifier LNA) are in accordance with the specifications, it is possible to move to a third test step TEST-TX in order to check the gain characteristics of the transmission path. If not, the test stops and the module is rejected (not compliant).

STEP OF TESTING THE TRANSMISSION PATH TX OF THE MODULE, TEST-TX

In this step, it is the amplifier LNA that is used as calibration radiofrequency signal generator (MODE$_{LNA}$ at "1"), and the switch X1 in reception mode RX makes it possible to measure an LF characteristic of the RF calibration signal obtained at output OUT$_{RX}$ of the path RX, using the associated detector DET$_B$ (item of data DATA-B).

Next, the loopback switch X$_{LP1}$ is activated (LP$_1$ at "1") in order to inject this RF calibration signal obtained at output OUT$_{RX}$ onto the input IN$_{TX}$ of the transmission path TX, and the circuit DET$_A$ measures a corresponding LF characteristic (switch X2 in transmission mode). The ratio DATA-A/DATA-B allows the test equipment to deduce a gain level of the transmission path (and/or of the power amplifier depending on the position of the loop switch).

Just as for the test phase TEST-RX, it is possible to adjust the accuracy of the converter or converters, adapt the DC bias conditions of the amplifier LNA used as calibration RF signal generator, and/or of the amplifier PA of the transmission path under test.

In both phases, it is possible to choose to perform the looping back at various locations of the transmission and reception paths, for example at the output of the amplifier LNA and the input of the amplifier PA (switch X'$_{LP1}$). In practice, it is necessary to make a compromise between the implementation constraints for the test resources (loopback switches and associated LF measuring circuits) and the exhaustiveness and the accuracy of the desired test.

The self-test resources integrated into the front-end modules according to the invention make it possible to relax the constraints on the test equipment ATE and to perform an effective high-volume test. The entire activation and setting of the various test phases, as well as the reading of the results, may be performed by the test equipment via the serial interface port and the associated volatile memory that are commonly provided in integrated circuits. The invention is however not limited to this implementation, and it is also possible to provide specific I/O logic signal pads for the test.

The invention has just been explained for a half-duplex front-end module. It applies equally well to a full-duplex front-end module. This is what is illustrated in FIG. 7. The module is then connected to two antennas, via two respective connection pads P2 (for the reception path) and P'2 (for the transmission path). There are then two antenna connections to be tested, using the amplifier associated with the pad to be tested as generator for generating a test RF sinusoidal signal, that is to say LNA at reception (P2) and PA at transmission (P'2).

The other test phases TEST-RX and TEST-TX may take place as described above with reference to FIGS. 4 to 6 for a half-duplex module, using a loopback switch X$_{LP1}$ and X$_{LP2}$ on each side of the paths. In the example illustrated, provision is then made for an LF characteristic detector associated with each of the pads P1 and P1', P2 and P2'. It has been seen for example that, if using a D-RC peak voltage detection circuit, this is a very small circuit that is very easy to integrate. A single detector on each side could however be used. For example, in order to measure the signal IN$_{TX}$ (TEST-TX) or OUT$_{RX}$ (TEST-RX), one and the same detector, DET$_B$, could be used, by activating the loop switch, X$_{LP1}$ in the example, as required for the test TEST-RX. The same applies on the antenna side. A small amount of accuracy may be lost for the measurement requiring use of the loop switch.

The invention that has just been described in general applies to any RF communication/modulation technique. It will be noted in this respect that, in the case of phase-quadrature digital modulation, the circuits $RF_{UP}$ and $RF_{DWN}$, if they are present, each have one branch per quadrature, and there is therefore one I/O interface pad with the baseband processing circuit (CIP) per quadrature. In this case, if it is desired to test the complete transmission and reception paths of the module, it is also necessary to provide one LF characteristic detector per quadrature. It is possible to optimize the number of detectors to be integrated by using the loop switches, as already explained.

Various embodiments of amplifiers able to be reconfigured as an oscillator according to the principle of the invention will now be given as an example. It is not possible to exhaustively list all low-noise or power radiofrequency amplifier topologies. There are too many of them and they depend on the useful frequency domain, but it is possible to distinguish between two major categories: differential-pair structures, used widely in the high-frequency domain for the signal stability quality that they provide; and non-differential structures with a cascode transistor configuration. An explanation will therefore be given of how the invention may be applied for these two types of structure. A person skilled in the art will know how to apply the principles that will be explained to the practical RF amplifier embodiments LNA or PA by making the necessary adjustments.

FIG. 8 shows a full-duplex front-end module primarily comprising the reception path input low-noise amplifier stages and the transmission path output power amplifier stages in a differential pair topology. These topologies are widely used for very high frequencies, for example in the 60 GHz band.

Let us take the reception path. The low-noise amplifier is coupled to the antenna pad P2 via an input transformer Trf1 (a balun) that changes the signal received from the antenna connected to the pad P2 to differential mode. The low-noise amplifier comprises at least two stages LNA1 and LNA2 (respectively an input stage and what is called a "driver" stage) in order to achieve the expected gain and noise performance. The stage LNA1 is the one that is coupled to the antenna pad P2 (via the balun Trf1). It has an operational operating mode as an amplifier and another operating mode under test, as an oscillator, depending on the logic state of the control signal $MODE_{LNA}$, which is set in a register of control parameters of the module, via the serial interface port provided for these functions. The stage LNA1 receives RF signals in phase opposition (from Trf1) at inputs $In_1+$ and $In_1-$. At output $Out_1+$ and $Out_1-$, it provides a differential signal that is applied to the primary of a second transformer Trf2 interposed between the stages LNA1 and LNA2. The stage LNA2 for its part provides a differential signal to a third transformer Trf3, which forms the differential interface to downstream circuitry (integrated or not integrated into the module). In the example, the secondary of this transformer is connected to respective pads P1+et P1−, allowing the interface with another integrated circuit (CIP, FIG. 1). The stage LNA2 could be able to be reconfigured as an oscillator, on command by the same signal $MODE_{LNA}$, but this is not necessary in practice, thereby making it possible to limit the number of test resources to be integrated into the module.

The power amplifier has a dual topology. It receives a differential RF signal from upstream circuitry, via input pads P'1+ and P'1−. Its differential output is coupled to the antenna pad P2' via a transformer. The output stage PA2, which is the one that is coupled to the antenna pad P'2 (via a balun), has the two operating modes operational (amplifier) and under test (oscillator) according to the invention, configured by the control signal $MODE_{PA}$ that is set in the register of control parameters of the module, via the serial interface port of the module. PA1 may possibly also be able to be reconfigured as an oscillator.

As is well known, to improve gain and stability, the structure of the differential-pair amplifiers generally incorporates a cross-coupled Neutrodyne pair that has a negative feedback function in phase opposition in order to counter the Miller effect caused by the gate-drain capacitances of the field-effect transistors and that is expressed notably through phase offsets that are harmful to the stability of the assembly.

Figure 9:
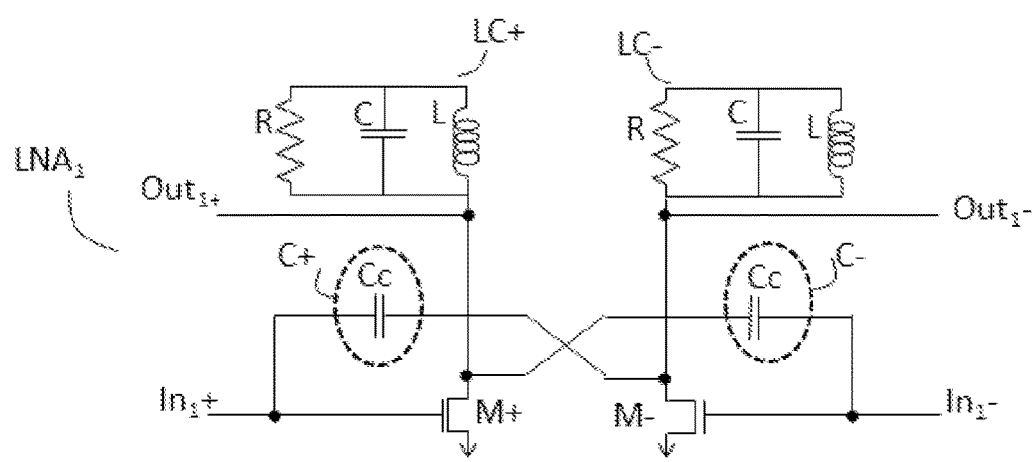
FIG. 9 is a simplified circuit diagram of an input structure of a differential-pair low-noise amplifier, comprising Neutrodyne capacitors.
Figure 10:
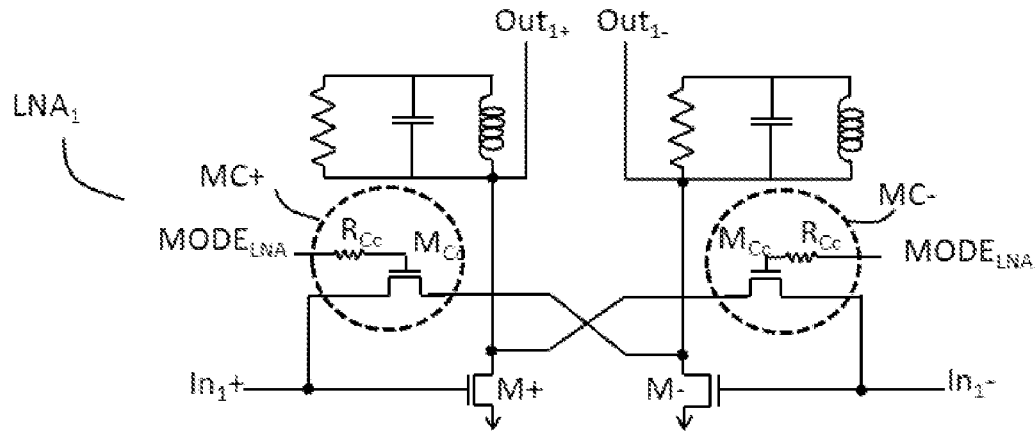
FIG. 10 is a circuit diagram of this transformed structure according to the invention, allowing operation as an amplifier in operational mode or as an oscillator in test mode.

FIG. 9 shows such an example of a differential-pair topology and a cross-coupled Neutrodyne pair, applied to the stage LNA1 of FIG. 8. Such a structure is known and described for example in the publication by A. Larie, E. Kervé, B. Martineau, V. Knopik, D. Belot, "A 1.2V 20 dBm 60 GHz Power Amplifier with 32.4 dB Gain and 20% Peak PAE in 65 nm CMOS" *European Solid State Circuits Conference* (*ESSCIRC*), 2014 IEEE, 22-26 Sep. 2014.

The differential pair is formed by two identical field-effect transistors M+ and M− in a common source configuration. A first Neutrodyne capacitor C+ is connected between the output $Out_1-$ (drain of the field-effect transistor M−) and the input $In_1+$ (gate of the field-effect transistor M+) and another Neutrodyne capacitor C− is connected between the output $Out_1+$ (drain of the field-effect transistor M+) and the input $In_1-$ (gate of the field-effect transistor M−). The two capacitors are identical, with a capacitance Cc. These capacitances may be produced in the form of discrete passive elements (capacitors); but they are more often than not formed by a transistor whose drain and source have been short-circuited together, forming a first electrode, the other electrode being formed by the gate of the transistor. Reference is made to a "MOS" capacitance, and the values of these capacitances are well-suited for these Neutrodyne functions. The equivalent MOS capacitance is equal to the sum of the gate-source Cgs and gate-drain Cgd capacitances of the transistors.

Moreover, each of the outputs $Out_1+$ and $Out_1-$ of the stage is charged by a respective resonant circuit LC+ and LC− corresponding to the primary of the output transformer Trf2 which, by design, are circuits that resonate at a natural frequency $f_0$ (dependent on L and C) that is in the useful frequency band (in the example in what is called the 60 GHz band (typically 57-66 GHz)). For example, $f_0$ has a value around 62 GHz. The two resonant circuits LC1 and LC2 are identical, to within dispersion factors, depending on the technology, and the notations R, L and C in the figure represent the equivalent resistance, capacitance and inductance values, including stray resistances and capacitances.

To reconfigure such an amplifier stage as an oscillator, as there are already Neutrodyne negative feedback loops, it is proposed highly advantageously to use a field-effect transistor $Mc_c$ to form the Neutrodyne capacitance in each branch of the cross-coupled pair, but in a series connection as a switch, between the gate of one of the transistors of the differential pair (M− for example) and the drain of the other transistor of this pair (M+ in the example). Each transistor $Mc_c$ is controlled (on its gate) by the signal $MODE_{LNA}$. In blocked mode, its equivalent capacitance $C_t$ becomes $Ct=Cds+(Cgs \times Cgd)/(Cgs+Cgd)$, depending on the drain-source Cds, gate-drain Cgd and gate-source Cgs capacitances of the transistor $Tc_c$, and it is set such that it is equal to the predefined Neutrodyne value Cc (appropriate dimensioning of the transistor). The logic state "0" of the signal $MODE_{LNA}$ then determines the standard operating mode of the stage LNA1. In the example of N-channel FET transistors, in the state "0", the transistors $Mc_c$ are in the off state and provide the Neutrodyne capacitor function. The stage LNA1 then performs an amplifier function.

In the state "1", the transistors $Mc_c$ are in the on state to saturation, equivalent to a short circuit (low resistance $R_{on}$), forming a cross-coupled pair providing positive feedback in the structure, based on operation as an electronic oscillator at the natural frequency $f_0$ of the LC resonant circuit. At input and at output is a sinusoidal signal at the frequency f0, which is transmitted on the antenna connection pad P2 (FIG. 8) and also to LNA2 and to the rest of the reception chain. It is this signal that is used according to the invention as RF test signal (TEST-ANT) to check/qualify the antenna connection for the module operational frequency band, when the pad P2 is connected to an antenna or an equivalent load $Z_{ANT}$; and it is this signal that will be able to be used as RF calibration signal to test the transmission path as explained above (TEST-TX).

The control signal $MODE_{LNA}$ is preferably applied to the gate of the field-effect transistors $Tc_c$ via a resistor $Rc_c$, so as to avoid the radiofrequency signals being able to be short-circuited to ground when these transistors behave as a Neutrodyne capacitor (operational mode). In practice, the resistance has to be high enough, that is to say, have a value equal to or greater than 1 kOhm.

The stage LNA1 thus comprises a pair of circuits MC+, MC− (a FET transistor $Mc_c$ and a resistor $Rc_c$), which acts as a simple or Neutrodyne cross-coupled pair depending on the operating mode controlled by the signal $MODE_{LNA}$.

In one variant, there may be provision for each of the stages of the amplifier LNA (LNA1 and LNA2 in the example) to comprise such a pair of circuits MC+ and MC−, driven by the same control signal $MODE_{LNA}$.

Everything that has just been stated for a low-noise amplifier applies in the same way to a differential-pair power amplifier (replacing the pair of Neutrodyne capacitors with a pair of controlled transistor circuits).

The proposed embodiment is particularly advantageous as it has been seen in practice that the Neutrodyne capacitors are generally formed by transistors. In other words, the proposed implementation does not compromise the entire design/topology of the amplifier stage, notably with regard to RF considerations (couplings).

The structure of the amplifier LNA and/or PA may also be a non-differential structure. In this case, it is necessary to add a controlled circuit (for example a field-effect transistor controlled on its gate by a self-test control signal, preferably through a high resistance) in an electronic oscillator loop to the basic topology.

Various electronic oscillator forms are known, notably the Colpitts oscillator and the Hartley oscillator. In the Colpitts oscillator, the oscillating frequency is determined by two capacitors and an inductor, and in the Hartley oscillator, the oscillating frequency is determined by two inductors and a capacitor. The Colpitts structure is of more particular interest, and it will be shown that it is easily possible to produce such an oscillator on command in an LNA or PA amplifier stage with a non-differential structure.

Figure 11:
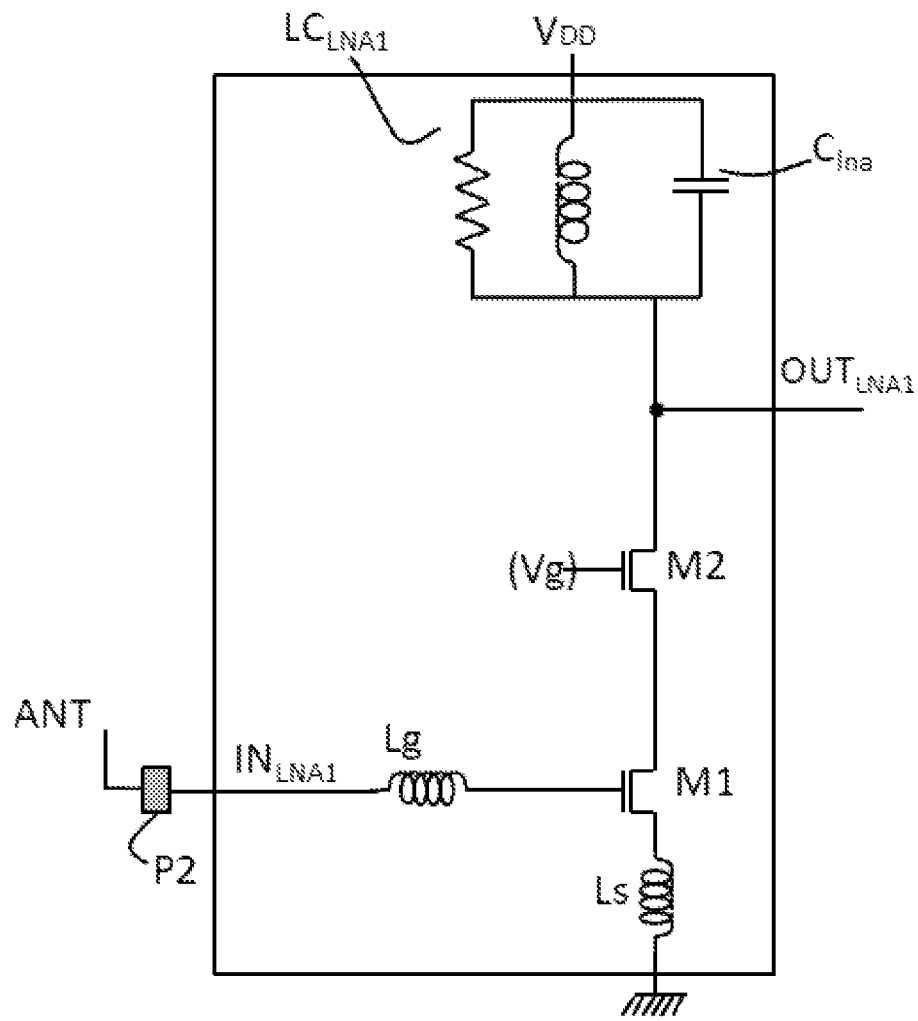
FIG. 11 is a simplified circuit diagram of a low-noise amplifier stage in a non-differential cascode topology with inductive degeneration.

FIG. 11 shows a known structure of an LNA amplifier stage, of the type with a common source configuration, in one example of an inductive source degeneration topology. This type of configuration is widely used in radiofrequency because it offers very good performance in terms of noise. Such a configuration is described for example in the document D. K. Shaeffer and T. H. Lee, "A 1.5-V, 1.5-GHz CMOS low noise amplifier," in *IEEE Journal of Solid-State Circuits*, vol. 32, no. 5, pp. 745-759, May 1997.

The RF signal from the antenna pad P2 is applied via a first inductor Lg to the gate of a field-effect transistor M1 (input transistor) that is in a common source configuration, via a second inductor Ls. Lg and Ls facilitate impedance matching at input. This transistor M1 is connected in series with a current bias transistor, M2, controlled to saturation (logic voltage $V_{DD}$ applied to its gate), in the on state, equivalent to a low resistance. The output node of the amplifier is formed by the drain of the transistor M2, and it is charged by a resonant circuit $LC_{LNA1}$, formed primarily of discrete passive elements, whose inductance value $L_{lna}$ and capacitance value $C_{lna}$ are dimensioned on the basis of the useful operating band, so as to resonate at a frequency $f_0$ within this band. The resistance, represented symbolically, shows the stray resistances inherent to the structure.

Figure 12:
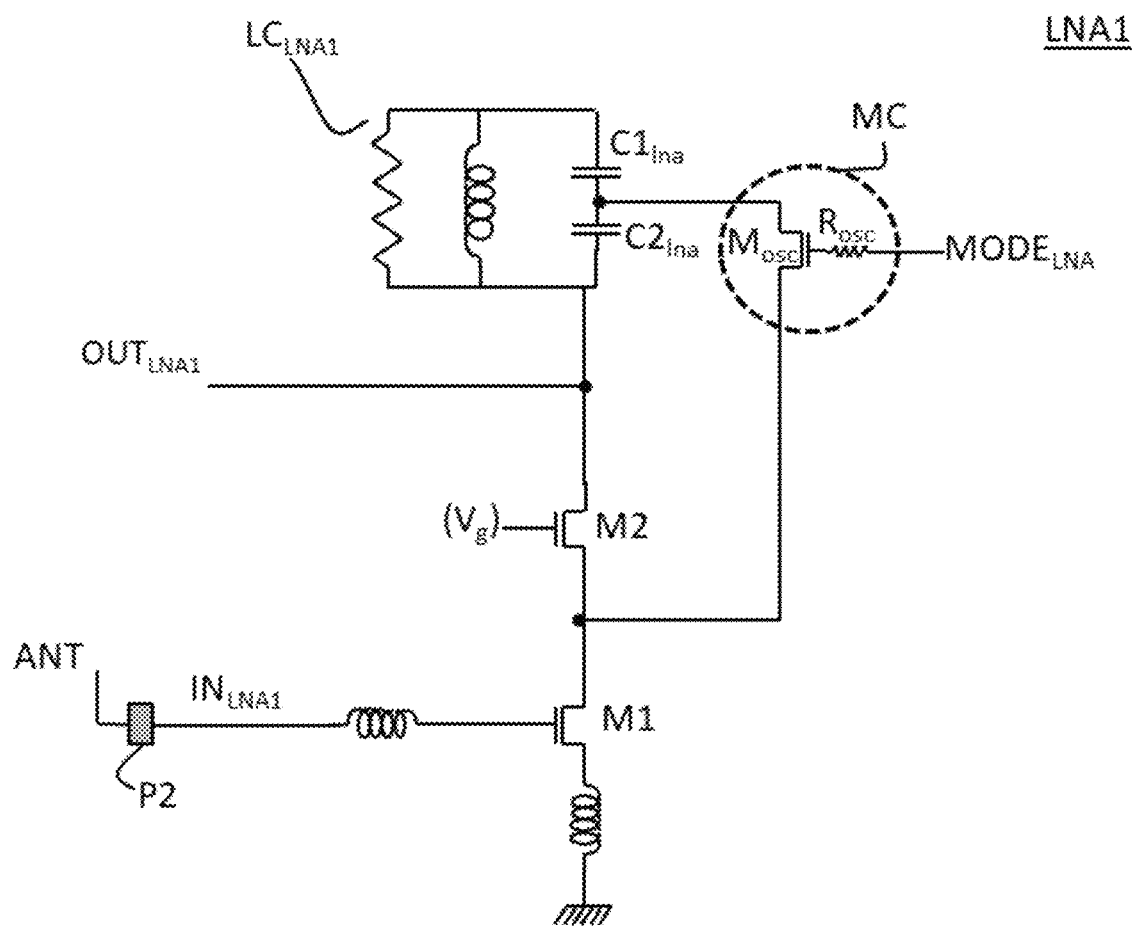
FIG. 12 shows a shrewd transformation of this structure to produce an amplifier able to be reconfigured as an electronic oscillator in test mode according to the invention.

According to the invention, as illustrated in FIG. 12, the capacitance $C_{lna}$ is formed using not a single capacitor element, but two elements, $C1_{lna}$ and $C2_{lna}$ in series, the respective capacitance values c1 and c2 of which are such that the equivalent capacitance of the series assembly, (c1× c2)/(c1+c2), equal to the capacitance value of the capacitor $C_{lna}$ of the resonant circuit $LC_{LNA1}$; and a control circuit $MC_{LNA}$ based on a field-effect transistor $M_{OSC}$ configured as a switch controlled by the signal $MODE_{LNA}$. This transistor $M_{OSC}$ is connected between the connection point between the two capacitors $C1_{lna}$ and $C2_{lna}$, on the one hand, and a connection point between the two capacitors M1 and M2, on the other hand.

In operational mode ($MODE_{LNA}$ at "0"), $M_{OSC}$ is equivalent to a capacitance Ct (as already described above), such that the feedback loop is open, and does not have any effect on the operation as an amplifier in the useful bandwidth.

In self-test mode ($OSC_{LNA}$ at "1"), $M_{OSC}$ is equivalent to a low resistance, closing (therefore activating) the negative feedback loop: the amplifier is then reconfigured as an electronic oscillator, at the resonant frequency of the resonant circuit $LC_{LNA1}$. The circuit diagram then corresponds to that of a Colpitts oscillator.

It is interesting to note that, in the embodiment of FIG. 12, the positive feedback loop that makes it possible to reconfigure the amplifier as an oscillator does not connect the output of the amplifier to its input, so to speak. Rather, a point situated upstream of the output (the node between the capacitors $C1_{lna}$ and $C2_{lna}$) is connected by the controlled switch $M_{osc}$ to a point situated downstream of the input (the node between the amplifier transistors M1 and M2). Moreover, it is noted that the oscillatory signal is present on the output of the amplifier LNA, but not on its input (the gate of M1), since, correctly, the looping back takes place downstream of this input. In other embodiments (see for example FIG. 10), it is possible for the oscillatory signal to be present at the input of the amplifier but not, or only slightly, on its output.

Figure 13:
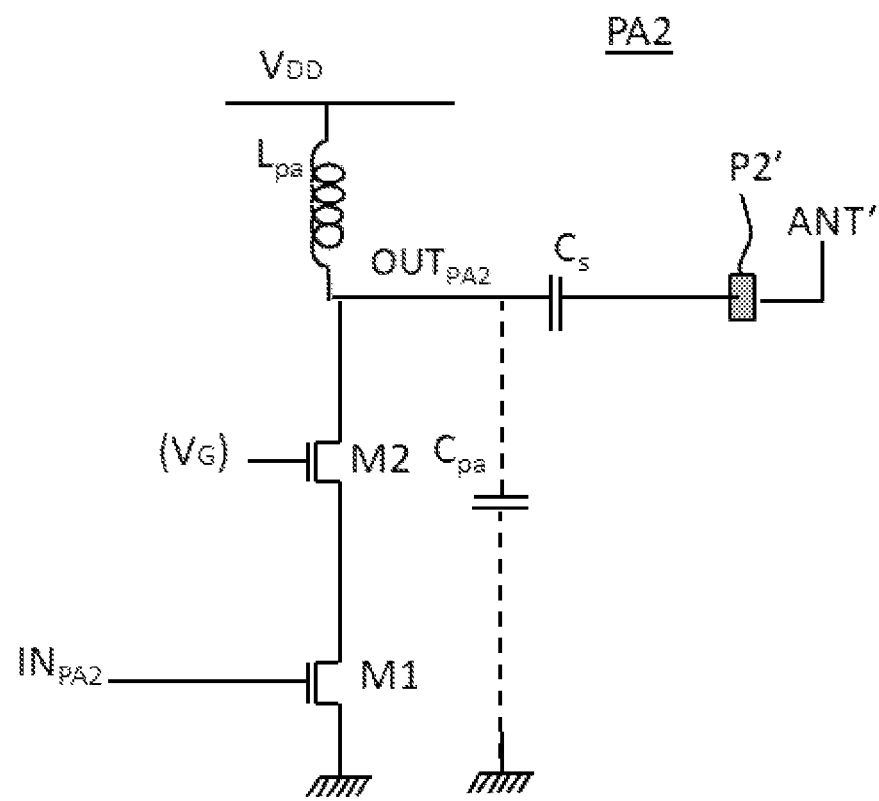
FIG. 13 is a simplified circuit diagram of a power amplifier stage in a non-differential cascode topology.
Figure 14:
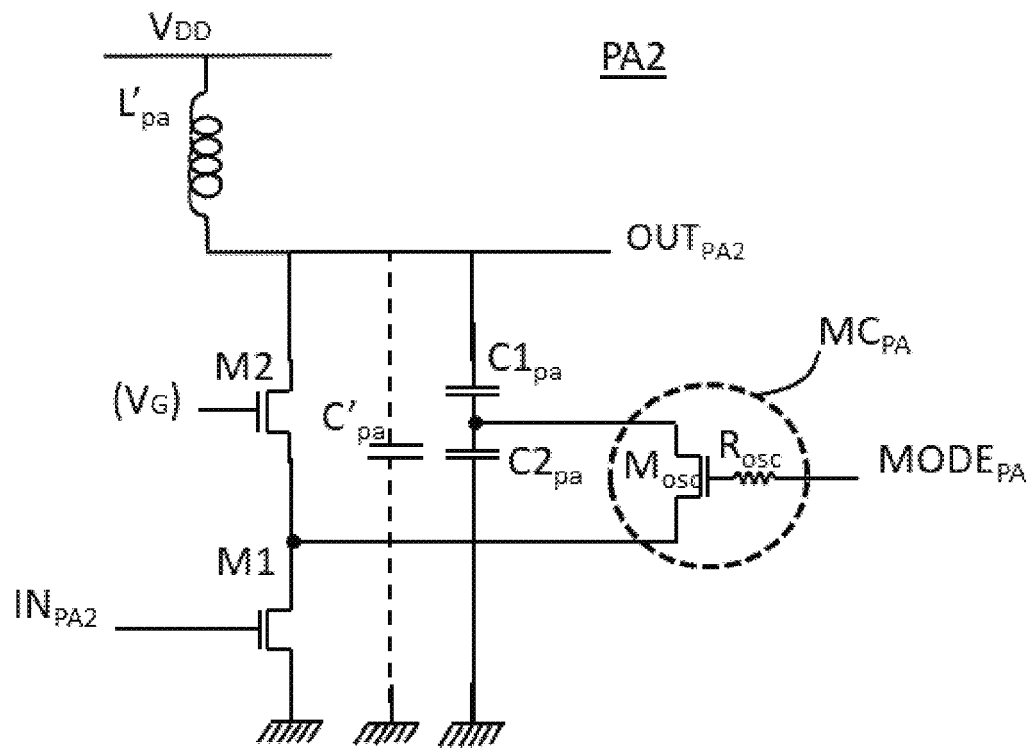
FIG. 14 illustrates a transformation of this structure into an amplifier able to be reconfigured as an electronic oscillator, according to the invention.

FIGS. 13 and 14 show an equivalent transformation performed in a non-differential cascode structure of a power amplifier, which corresponds to a structure described in the publication by T. Sowlati and D. Leenaerts, "A 2.4 GHz 0.18/spl mu/m CMOS self-biased cascode power amplifier with 23 dBm output power," 2002 *IEEE International Solid-State Circuits Conference. Digest of Technical Papers* (Cat. No. 02CH37315), San Francisco, CA, USA, 2002, pp. 294-467 vol. 1.

FIG. 13 illustrates the starting structure of the stage PA2. It comprises two transistors M1 and M2 in series. An RF signal from upstream electronic circuitry (a previous amplifier stage for example) is applied at input $IN_{PA2}$ to the gate of the transistor M1 in a common source configuration and the drain of the transistor M2 provides the signal at output $OUT_{PA2}$. The resonant circuit for tuning the output load is formed here by an inductor $L_{pa}$ connected to the drain of the transistor M2 and the output stray capacitance $C_{pa}$ of the stage PA2. $L_{pa}$ is dimensioned on the basis of $C_{pa}$ so as to obtain a determined resonant frequency f0, in the useful operating band of the amplifier. A capacitor $C_s$ is generally provided at output of the stage in order to produce a coupling capacitance whose role is to avoid an injection of DC current to the antenna.

According to one embodiment of the invention, and as illustrated in FIG. 14, this structure is transformed in order to produce a controlled feedback loop allowing the amplifier stage to be reconfigured as an electronic oscillator, by incorporating a branch of two capacitors $C1_{pa}$ and $C2_{pa}$ in series in parallel across the output $OUT_{PA2}$ of the stage. It is then possible, as above, to incorporate a controlled circuit $MC_{PA}$ comprising a field-effect transistor $M_{osc}$ configured as a switch controlled by a signal $MODE_{PA}$, preferably through a resistor $R_{osc}$, between a connection point between the two capacitors $C1_{pa}$ and $C2_{pa}$, on the one hand, and the connection point between the two transistors M1 and M2, on the other hand.

In operational mode ($MODE_{PA}$ at "0"), the transistor $M_{OSC}$ is equivalent to a capacitance (Ct), and the feedback loop is open, inactive, without any effect on the operation as an amplifier in the useful bandwidth. In self-test mode (MODEPA at "1"), the transistor $M_{OSC}$ is equivalent to a low resistance, activating the feedback loop (closed loop): the amplifier is then reconfigured as an electronic oscillator (Colpitts), at the resonant frequency $f_0$ of the resonant circuit. The inductance of the resonant circuit is then adjusted to a value L'na that takes into account the placing of the stray capacitance $C_{pa}$ of the stage in parallel with the two capacitors $C1_{pa}$ and $C2_{pa}$ in series. (It is assumed that the value of $C_{pa}$ is unchanged.)

These various examples show that the invention may easily be implemented in current amplifier topologies used in radiofrequency mode, both for low-noise amplifiers and for power amplifiers, and in a manner highly embedded with operational circuitry.

The description demonstrates that the invention is easy to implement and inexpensive. The implementation is even easier and more advantageous in differential structures, since it uses a negative feedback loop already present in the topology of the amplifier, without the addition of extra active elements (Neutrodyne capacitors generally formed by transistors), this being optimum in terms of design and surface area. There is notably no need to resize the elements of the circuit for tuning the load at output. These examples however also show that it is easy to add a feedback loop in order to produce an electronic oscillator topology, for example a Colpitts oscillator, which minimizes the implementation surface and the associated adaptation (design) costs.

The invention has been described with reference to a certain number of embodiments, but it is not limited thereto. For example:

The amplifier reconfigured as an oscillator, whether this is a low-noise amplifier or a power amplifier, may generate an RF signal on its input, on its output or on both, depending on its topology.

In the embodiments described in detail above, the amplifiers are reconfigured as oscillators by virtue of "intrinsic" loopback, that is to say obtained by opportunistically modifying their internal structure. It is also possible to provide "extrinsic" loopback, by adding an open or closed loopback path by way of a controlled switch (typically a transistor) that does not play any role in the "normal" operation of the amplifier.

It is not necessary for all of the tests described with reference to FIG. 4 to be performed, and even less so for them to be performed in this order. For example, it is possible firstly to test the front-end modules (RX and/or TX tests) before connecting them to respective antennas, and then possibly to test the antenna connection.

It is possible to add functions intended to be used only in a pre-industrialization phase, in order to test or characterize the first front-end modules that are manufactured. For example, as has been explained above, it is possible to perform spectral analysis by providing a drivable varactor in the LNA, thereby making it possible to obtain a variable-frequency oscillator. A spectral analyser then makes it possible to measure the signal-to-noise ratio of the reception chain as a function of frequency.

In the case of the circuit of FIG. 8, in which the amplification of the received signals is performed by two LNAs connected in cascode (LNA1, whose input is connected to the antenna, and LNA2, whose input is connected to the output of LNA2), consideration has been given to the case in which it is the first amplifier (LNA1) that is reconfigured as an oscillator, and that the RF signal tapped off at its input is used to test the antenna connection. However, in the majority of cases, an RF signal is also present at the output of LNA1, and this signal is amplified by LNA2. Now, the impedance present at the input of LNA1 also affects the RF signal present at its output. As a result, the antenna connection may also be tested by performing a measurement on the signal tapped off at the output of LNA2, which has the advantage of being stronger than the signal at the input of LNA1. It is also possible to perform two measurements, one at the input of LNA1 and the other at the output of LNA2, and to deduce the impedance experienced at the pad P2 therefrom.

Other measuring circuits may be used instead of the peak voltage measuring circuit $DET_A$ to acquire a low-frequency characteristic of a radiofrequency signal present on an input or an output of the amplifier reconfigured as an oscillator. Mention may be made by way of example of:

A power detector connected to an RF coupler, see for example J. Gorisse et al. "A 60 GHz CMOS RMS Power Detector for Antenna Impedance Mismatch Detection" Northeast Workshop on Circuits and Systems, June 2008, Montreal, Canada. pp. 8018.

A reflectometer, see for example H. Chung et al. "A 0.001-26 GHz Single-Chip SiGe Reflectometer for Two-Port Vector Network Analyzers", 017 IEEE MTT-S International Microwave Symposium (IMS) (2017): 1259-1261.

The characterization of an antenna connection, or more generally an impedance (mis)match, may also be obtained in a manner other than by measuring a low-frequency characteristic of the RF signal on a port of the amplifier reconfigured as an oscillator. For example, it is known to detect an impedance mismatch, see for example US 2016-0211813.

As has been explained above, it is more generally possible to measure a signal generated following propagation of the radiofrequency signal in at least one component of the integrated circuit, other than the amplifier reconfigured as an oscillator, in order to deduce characteristics of this component therefrom. For example, if the radiofrequency signal is generated by a low-noise amplifier reconfigured as an oscillator, it is possible to measure the power thereof, the distortion or the signal-to-noise ratio of the radiofrequency signal after it has passed through the other components of the reception path or even, provided that appropriate loopback is provided, the transmission path. Reciprocally, if the radiofrequency signal is generated by a low-noise amplifier reconfigured as an oscillator, it is possible to measure the power thereof, the distortion or the signal-to-noise ratio of the radiofrequency signal after it has passed through the reception path.

Figure 15:
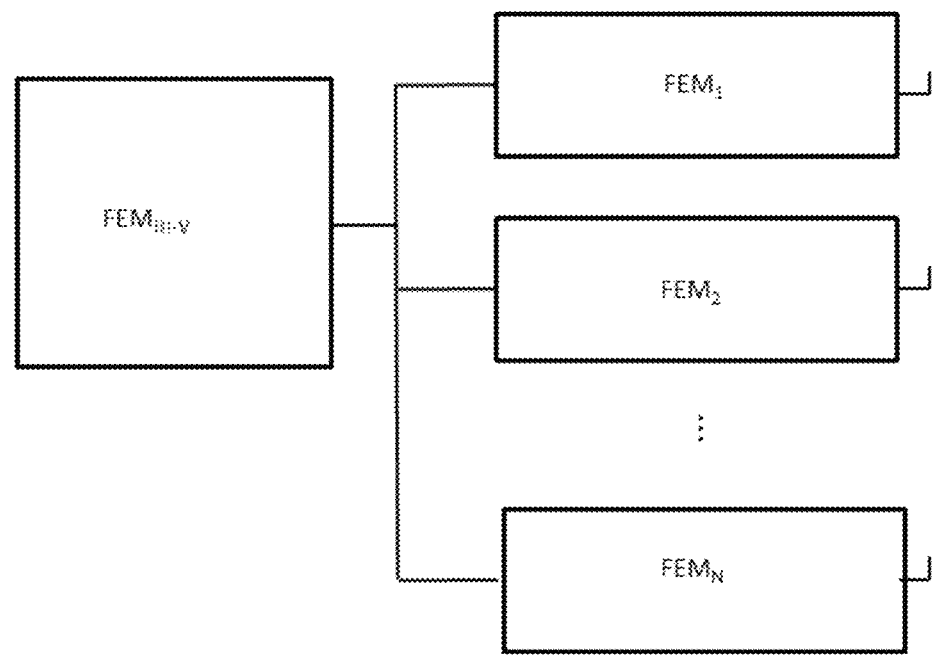
FIG. 15 illustrates an antenna system comprising a plurality of front-end modules produced using different technologies.

Instead of being connected directly to an antenna, the front-end module may for example be connected to one or more other front-end modules, these being connected to one or more antennas. For example, in the case of FIG. 15, there is provision for a high-power "upstream" front-end module $FEM_{III-V}$ produced using III-V technology—particularly suitable for such an application. This upstream module is connected to a plurality of "downstream" modules $FEM_1$, $FEM_2$, . . . $FEM_n$ using CMOS technology (less able to manage high powers, but allowing higher integration levels, and therefore more sophisticated signal processing), each connected to a respective antenna. The "downstream" front-end modules form a plurality of transmission/reception paths and are connected to the pad P2 (which may possibly be split into a transmission pad and a reception pad) by a multiplexed transmission line, making it possible to distribute the RF signals with 50-ohm impedance matching on either side.

The invention claimed is:

1. A radiofrequency transmission and/or reception integrated circuit comprising:
at least one radiofrequency signal amplifier, said at least one radiofrequency signal amplifier being configured, in operational mode, so as to perform a function of amplifying a first radiofrequency signal applied at an input, said at least one radiofrequency signal amplifier being configured so as to perform an oscillator function in a self-test mode of the integrated circuit, to generate a second radiofrequency signal on at least one of the input or an output of said at least one radiofrequency signal amplifier,
wherein the integrated circuit is configured, in said self-test mode, so as to allow said second radiofrequency signal to propagate in at least one component of said radiofrequency integrated circuit, separate from said at least one radiofrequency signal amplifier, and in that it also comprises a measuring circuit for measuring a signal generated following propagation of said second radiofrequency signal in said component of said integrated circuit and representative of at least one characteristic of said component, said at least one radiofrequency signal amplifier comprises a field-effect transistor controlled as a switch by an operating mode control signal, said switch forming a feedback loop between two nodes of the at least one radiofrequency signal amplifier and a node coupled to its input, said loop being open, corresponding to a blocked mode of said transistor, in operational mode, and closed, corresponding to a conductive mode of said transistor, in self-test mode.

2. The integrated circuit according to claim 1, wherein said measuring circuit is a measuring circuit for measuring a low-frequency characteristic of said second radiofrequency signal.

3. The integrated circuit according to claim 2, wherein said at least one measuring circuit is a peak voltage measuring circuit.

4. The integrated circuit according to claim 1, comprising a reception path having at least one first amplifier stage and a transmission path having at least one last amplifier stage, wherein said at least one radiofrequency signal amplifier is the first amplifier stage of the reception path or the last amplifier stage of the transmission path and is coupled, via its input or its output, to an antenna connection pad.

5. The integrated circuit according to claim 1, wherein said at least one radiofrequency signal amplifier is a differential-pair amplifier and comprises a feedback loop comprising a transistor controlled as a switch associated with each of inverting and non-inverting outputs of a stage, wherein said transistor controlled as a switch forms a Neutrodyne capacitor in operational mode and a short-circuit in self-test mode of the integrated circuit, then configuring said at least one radiofrequency signal amplifier as an electronic oscillator.

6. The integrated circuit according to claim 1, wherein said at least one radiofrequency signal amplifier is a non-differential amplifier and comprises:
a first field-effect transistor in a common source configuration and a gate electrode of which forms a signal input of the at least one radiofrequency signal amplifier, in series with a second field-effect transistor of which a drain electrode forms a signal output node of the at least one radiofrequency signal amplifier,
a resonant circuit (for tuning a load of the output node, comprising two capacitors in series, and
a feedback loop controlled by the operating mode control signal, comprising a field-effect transistor controlled as a switch connected between a connection node between said first and second field-effect transistors and a connection node between the two capacitors.

7. The integrated circuit according to claim 1, comprising a reception path having at least one first amplifier stage and one transmission path having at least one last amplifier stage, wherein said first amplifier stage (LNA1) of the reception path and said last amplifier stage of the transmission path each have an amplification function in operational mode and an oscillator function in self-test mode of the integrated circuit, controlled by a respective mode control signal.

8. The integrated circuit according to claim 7, furthermore comprising loopback means for looping an output of the transmission path back to an input of the reception path and at least one measuring circuit for measuring a low-frequency characteristic of the signal at the output of the reception path.

9. The integrated circuit according to claim 8, furthermore comprising loopback means for looping an output of the reception path back to an input of the transmission path and a measuring circuit for measuring a low-frequency characteristic of the signal measured at the output of the transmission path.

10. The integrated circuit according to claim 1, wherein the measuring circuit or circuits for measuring a low-frequency characteristic comprise a peak voltage detection circuit associated with a respective or shared analogue-to-digital converter.

11. A self-test method for a radiofrequency integrated circuit comprising the following steps:
a) configuring a radiofrequency signal amplifier in operational mode, so as to perform a function of amplifying a first radiofrequency signal applied at an input, said radiofrequency signal amplifier being configured so as to perform an oscillator function in a self-test mode of the integrated circuit, to generate a second radiofrequency signal on at least one of the input or an output of said radiofrequency signal amplifier, wherein the integrated circuit is configured, in said self-test mode, so as to allow said second radiofrequency signal to propagate in at least one component of said radiofrequency integrated circuit, separate from said radiofrequency signal amplifier, and in that it also comprises a measuring circuit for measuring a signal generated following propagation of said second radiofrequency signal in said component of said integrated circuit and representative of at least one characteristic of said component, said radiofrequency signal amplifier comprises a field-effect transistor controlled as a switch by an operating mode control signal, said switch forming a feedback loop between two nodes of the radiofrequency signal amplifier and a node coupled to its input, said loop being open, corresponding to a blocked mode of said transistor, in operational mode, and closed, corresponding to a conductive mode of said transistor, in self-test mode;

b) propagating said radiofrequency signal in at least one component of said radiofrequency integrated circuit, separate from said radiofrequency signal amplifier; and c) measuring a signal generated following propagation of said radiofrequency signal in said component of said integrated circuit, and deducing at least one characteristic of said component therefrom.

12. The method according to claim 11, wherein step c) comprises measuring a low-frequency characteristic of said radiofrequency signal.

13. The method according to claim 12, wherein step c) also comprises determining a load impedance of the radiofrequency signal amplifier when its input or its output is connected to an antenna or to an equivalent impedance load.

14. The method according to claim 11, wherein the integrated circuit comprises a reception path having at least one first amplifier stage and a transmission path having at least one last amplifier stage, wherein said radiofrequency signal amplifier is the first amplifier stage of the reception path or the last amplifier stage of the transmission path and is coupled, via its input or its output, to an antenna connection pad; the method comprising an antenna connection test step comprising:

connecting an antenna or an equivalent impedance load to said antenna connection pad, activating a control signal, in order to control reconfiguration of an amplifier stage coupled to said antenna pad, which is the first amplifier stage of the reception path or the last amplifier stage of the transmission path, as an electronic oscillator, and measuring a low-frequency characteristic of a signal measured between said at least one amplifier stage and said antenna connection pad, representative of an antenna load impedance, in order to discriminate between a correct and an incorrect antenna connection.

15. The method according to claim 11, the radiofrequency integrated circuit comprising a transmission path having at least one last amplifier stage able to be reconfigured as an electronic oscillator, and the radiofrequency integrated circuit furthermore comprises first loopback means for looping back the output of said last amplifier stage of the transmission path at the input of said at least one amplifier stage of a reception path, and a measuring circuit for measuring a low-frequency characteristic of the measured signal on an output of the reception path, the test method furthermore comprising a step of checking a reception path (TEST-RX), comprising the following steps:

activating a control signal in order to control reconfiguration of said last amplifier stage of the transmission path as an electronic oscillator, in order to generate a sinusoidal radiofrequency calibration signal at output, activating said first loopback means in order to inject said radiofrequency calibration signal at input of said at least one amplifier stage of the reception path, and measuring a low-frequency characteristic of said radiofrequency calibration signal and a corresponding signal delivered at output of the reception path, in order to establish a reception path gain.

16. The method according to claim 15, comprising an additional step of spectral analysis of the signal delivered at output of the reception path, in order to establish a noise level of the reception path.

17. The method according to claim 11, the radiofrequency integrated circuit comprising a reception path having at least one first amplifier stage able to be reconfigured as an electronic oscillator, and the radiofrequency integrated circuit furthermore comprises second loopback means for looping back an output of the reception path to an input of a transmission path, the self-test method furthermore comprising a step of checking a transmission path, comprising the following steps:

activating a control signal in order to control reconfiguration of said first amplifier stage of the transmission path as an electronic oscillator, in order to generate a radiofrequency sinusoidal signal in said reception path and obtain a radiofrequency calibration signal at the output of said path, activating said second loopback means in order to inject said radiofrequency calibration signal at the input of the transmission path, and measuring a low-frequency characteristic of said radiofrequency calibration signal and a corresponding signal delivered at the output of the transmission path, in order to establish a transmission path gain.

* * * * *

UNITED STATES PATENT AND TRADEMARK OFFICE
CERTIFICATE OF CORRECTION

PATENT NO. : 11,808,785 B2
APPLICATION NO. : 17/077809
DATED : November 7, 2023
INVENTOR(S) : Baudouin Martineau et al.

It is certified that error appears in the above-identified patent and that said Letters Patent is hereby corrected as shown below:

In the Claims

In Claim 6, Column 22, Line 23, "a resonant circuit (for tuning" should be -- a resonant circuit for tuning --.

In Claim 7, Column 22, Line 33, "amplifier stage (LNA1) of the reception" should be -- amplifier stage of the reception --.

In Claim 15, Column 24, Line 11, "a reception path (TEST-RX), comprising" should be -- a reception path, comprising --.

Signed and Sealed this
Ninth Day of January, 2024

Katherine Kelly Vidal
*Director of the United States Patent and Trademark Office*